(12) United States Patent
Crayford et al.

(10) Patent No.: US 11,221,110 B2
(45) Date of Patent: *Jan. 11, 2022

(54) LED LIGHT BULB CONSTRUCTION AND MANUFACTURE

(71) Applicant: SMARTBOTICS INC., Los Gatos, CA (US)

(72) Inventors: Ian Crayford, Saratoga, CA (US); Kelly Coffey, Los Gatos, CA (US); Jon Edwards, San Jose, CA (US)

(73) Assignee: SMARTBOTICS, INC., Los Gatos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/889,685

(22) Filed: Jun. 1, 2020

(65) Prior Publication Data

US 2020/0292138 A1 Sep. 17, 2020

Related U.S. Application Data

(63) Continuation-in-part of application No. 16/575,164, filed on Sep. 18, 2019, now Pat. No. 10,670,196,
(Continued)

(51) Int. Cl.
| | |
|---|---|
| *F21K 9/238* | (2016.01) |
| *H05B 47/19* | (2020.01) |
| *F21V 23/00* | (2015.01) |
| *F21K 9/23* | (2016.01) |
| *F21K 9/232* | (2016.01) |
| *F21K 9/235* | (2016.01) |
| *F21K 9/237* | (2016.01) |
| *F21V 23/06* | (2006.01) |

(Continued)

(52) U.S. Cl.
CPC ............... *F21K 9/238* (2016.08); *F21K 9/23* (2016.08); *F21K 9/232* (2016.08); *F21K 9/235* (2016.08); *F21K 9/237* (2016.08); *F21V 3/02* (2013.01); *F21V 3/061* (2018.02); *F21V 17/101* (2013.01); *F21V 23/005* (2013.01); *F21V 23/045* (2013.01); *F21V 23/06* (2013.01); *F21V 29/77* (2015.01); *H05B 47/19* (2020.01); *F21V 3/00* (2013.01); *F21V 23/006* (2013.01); *F21V 23/02* (2013.01); *F21Y 2101/00* (2013.01); *F21Y 2107/40* (2016.08); *F21Y 2115/10* (2016.08)

(58) Field of Classification Search
CPC ....................................................... F21K 9/23
See application file for complete search history.

(56) References Cited

U.S. PATENT DOCUMENTS

| 9,644,799 B2 * | 5/2017 | Crayford | .................. F21V 29/77 |
| 10,088,112 B2 * | 10/2018 | Crayford | .................. F21V 3/061 |

(Continued)

*Primary Examiner* — Alexander K Garlen
(74) *Attorney, Agent, or Firm* — Radlo & Su

(57) ABSTRACT

An LED light bulb with integrated power supply, and which may incorporate integrated communications and processing functions. The LED light bulb is designed to be efficiently manufactured in mass quantities using automated assembly techniques, and is constructed to exhibit the spatial light pattern of a regular incandescent bulb as closely as possible. Where communications and processing functions are integrated, the LED light bulb is able to communicate via wireless communications to a mobile phone, notebook, tablet, or other computing device.

8 Claims, 17 Drawing Sheets

Related U.S. Application Data which is a continuation of application No. 16/105,705, filed on Aug. 20, 2018, now Pat. No. 10,465,857, which is a continuation of application No. 15/465,437, filed on Mar. 21, 2017, now Pat. No. 10,088,112, which is a continuation of application No. 14/210,018, filed on Mar. 13, 2014, now Pat. No. 9,644,799.

(60) Provisional application No. 61/779,586, filed on Mar. 13, 2013.

(51) Int. Cl.

| | | |
|---|---|---|
| *F21V 23/04* | (2006.01) | |
| *F21Y 101/00* | (2016.01) | |
| *F21V 23/02* | (2006.01) | |
| *F21Y 115/10* | (2016.01) | |
| *F21Y 107/40* | (2016.01) | |
| *F21V 29/77* | (2015.01) | |
| *F21V 3/06* | (2018.01) | |
| *F21V 3/02* | (2006.01) | |
| *F21V 17/10* | (2006.01) | |
| *F21V 3/00* | (2015.01) | |

(56) References Cited

U.S. PATENT DOCUMENTS

| | | | | |
|---|---|---|---|---|
| 10,465,857 | B2* | 11/2019 | Crayford | F21K 9/23 |
| 10,670,196 | B2* | 6/2020 | Crayford | F21V 17/101 |
| 2012/0051069 | A1* | 3/2012 | Lim | F21V 3/02 |
| | | | | 362/373 |
| 2013/0100674 | A1* | 4/2013 | Kim | F21V 23/02 |
| | | | | 362/249.14 |
| 2013/0114251 | A1* | 5/2013 | Duan | F21K 9/23 |
| | | | | 362/235 |
| 2013/0128573 | A1* | 5/2013 | Leung | F21K 9/23 |
| | | | | 362/235 |
| 2014/0021862 | A1* | 1/2014 | Chung | F21V 29/70 |
| | | | | 315/112 |
| 2014/0126220 | A1* | 5/2014 | Chen | F21K 9/23 |
| | | | | 362/311.02 |
| 2015/0211687 | A1* | 7/2015 | Chung | H05B 47/19 |
| | | | | 315/34 |

\* cited by examiner

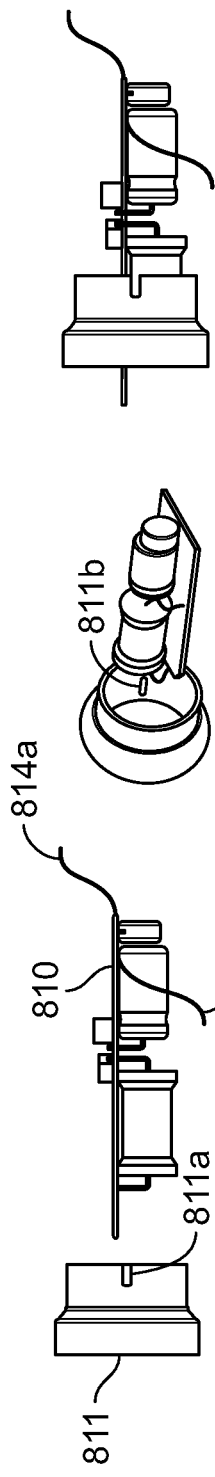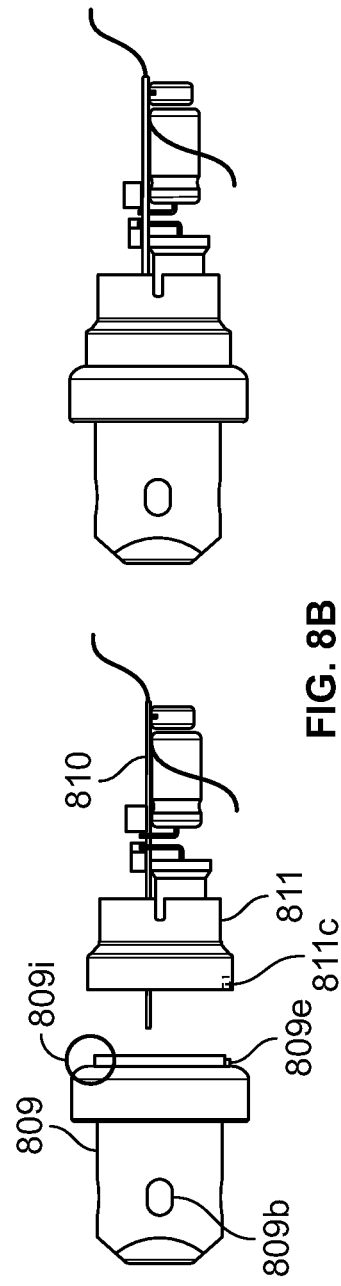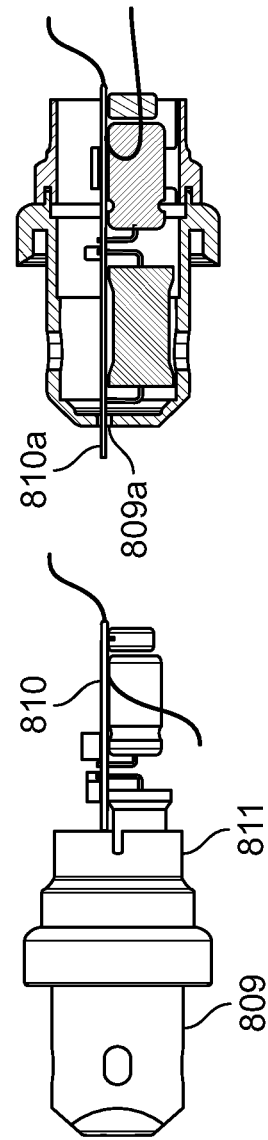
FIG. 8A
FIG. 8B
FIG. 8C

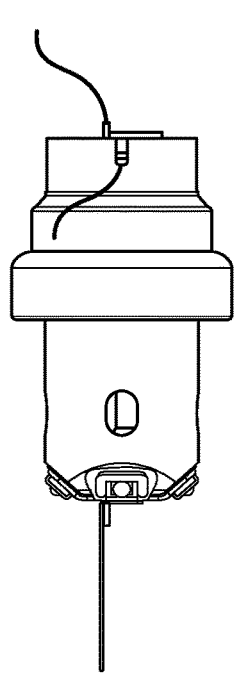
FIG. 8G
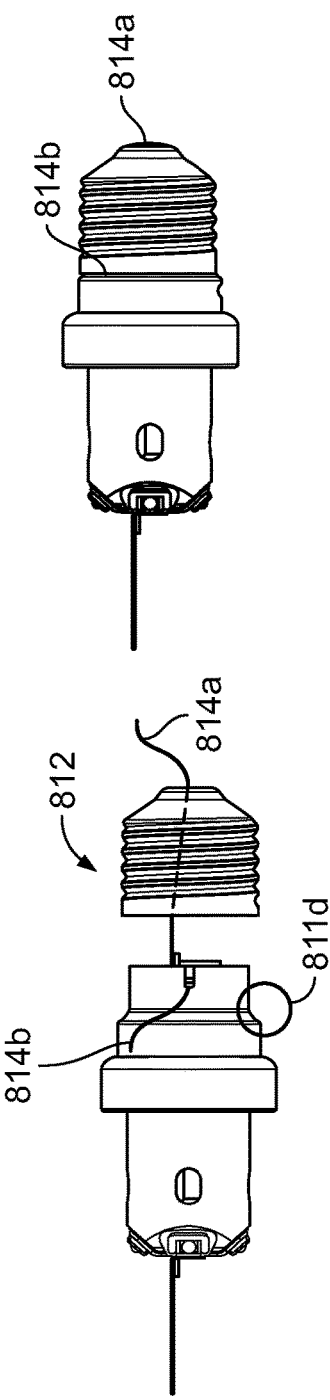
FIG. 8H
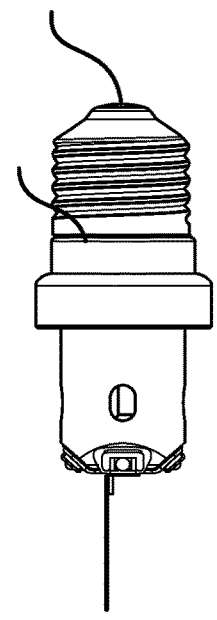
FIG. 8I
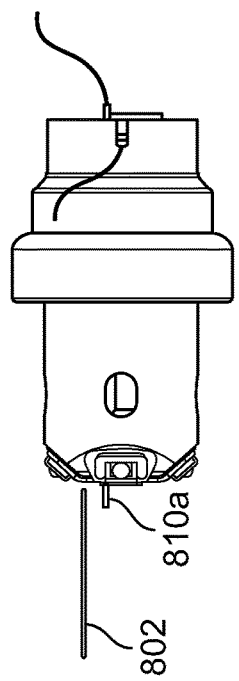

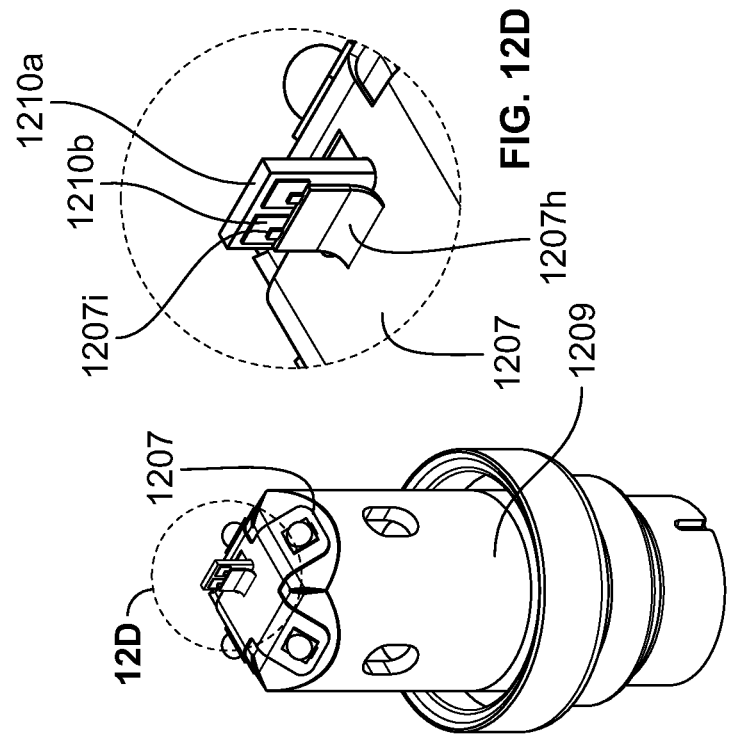
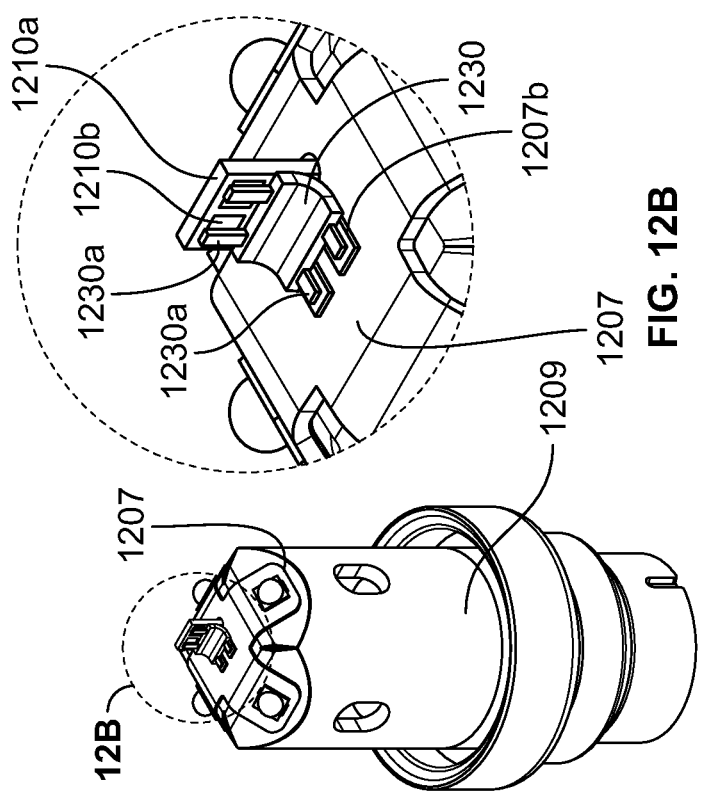

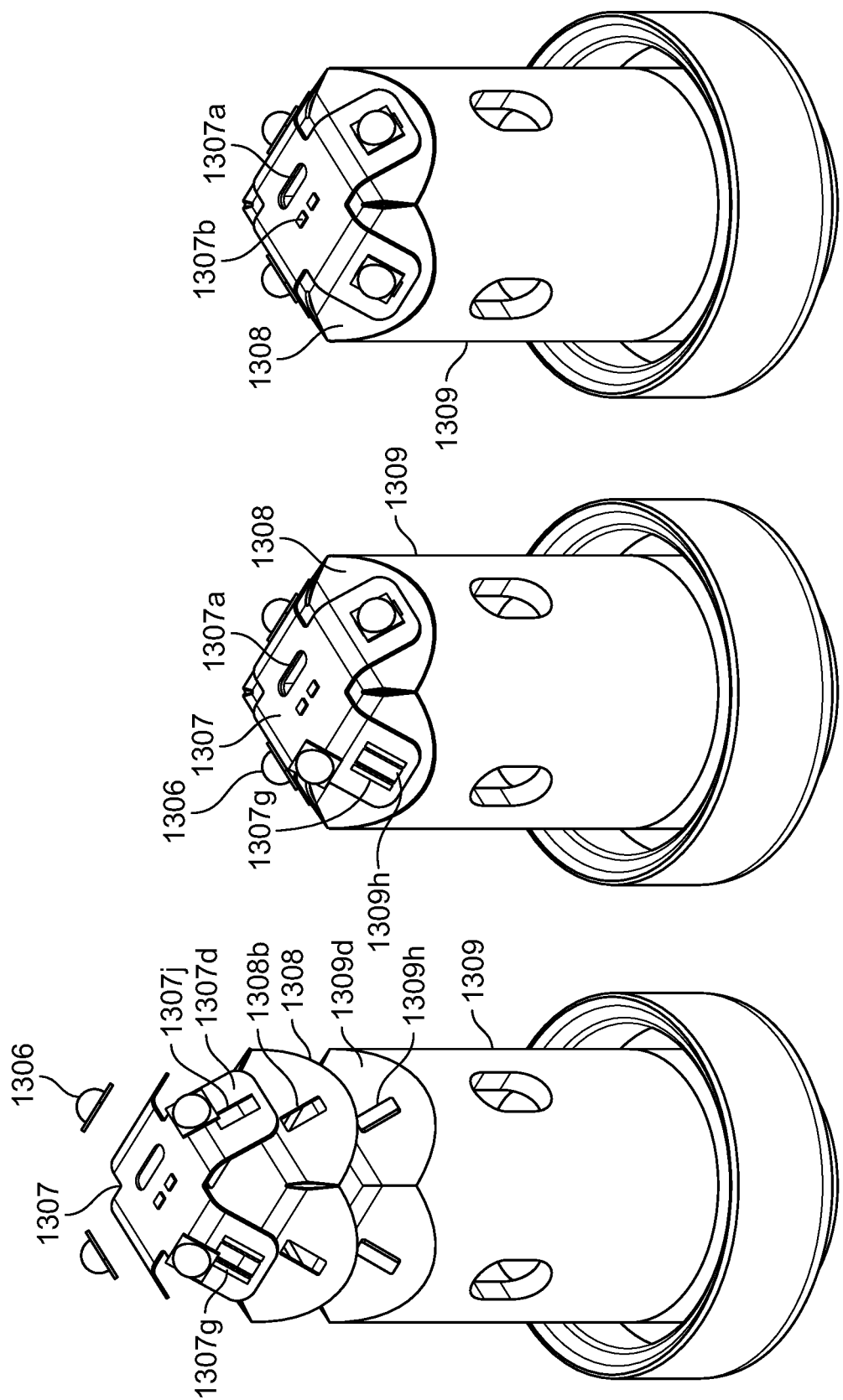

LED LIGHT BULB CONSTRUCTION AND MANUFACTURE

CROSS REFERENCE TO RELATED APPLICATIONS

This application is a continuation in part application of, and claims priority to, U.S. Non-Provisional application Ser. No. 16/575,164 entitled "LED Light Bulb Construction and Manufacture," filed on 18 Sep. 2019, now U.S. Pat. No. 10,760,196, which is a continuation application of, and claims priority to, U.S. Non-Provisional application Ser. No. 16/105,705 entitled "LED Light Bulb Construction and Manufacture," filed on 20 Aug. 2018, now U.S. Pat. No. 10,465,857, which is a continuation application of, and claims priority to, U.S. Non-Provisional application Ser. No. 15/465,437 entitled "LED Light Bulb Construction and Manufacture," filed on 21 Mar. 2017, now U.S. Pat. No. 10,088,112, which is a continuation application of, and claims priority to, U.S. Non-Provisional application Ser. No. 14/210,018 entitled "LED Light Bulb Construction and Manufacture," filed on 13 Mar. 2014, now U.S. Pat. No. 9,644,799, which claims priority to U.S. Provisional Application Ser. No. 61/779,586, filed on 13 Mar. 2013, the disclosures of which are incorporated herein by reference in their entireties for all purposes. This application is also related to U.S. Non-Provisional application Ser. No. 14/214,158 entitled "Adaptive Home and Commercial Automation Devices, Methods and Systems Based on the Proximity of Controlling Elements," filed on 14 Mar. 2014, now U.S. Pat. No. 9,800,429, which is incorporated herein by reference in its entirety.

TECHNICAL FIELD

This disclosure relates to LED light bulbs in general, as well as LED light bulbs incorporating integrated communications and processing functions. More particularly, the present disclosure describes technology to allow such bulbs to be efficiently constructed in mass production for domestic and commercial lighting systems.

BACKGROUND

Multiple factors have led to a major push worldwide to reduce electricity demand. These include the recognition of global warming regardless of cause; industrialization of third world countries creating huge increases in electricity demand and fossil fuel consumption, with the obvious economic and pollution problems associated; and increasing electricity prices within industrialized nations as overburdened electrical grid systems incur higher generation costs and struggle to match demand. During the last decade, there has become an increasing recognition that lighting systems are responsible for a substantial proportion of the total electricity consumed by homes and businesses (in the region of 20-25%).

Incandescent light bulbs are well understood and have been in existence since their commercialization in the late nineteenth century. All forms of incandescent light bulbs waste a substantial percentage of the electricity they consume in the generation of heat, rather than light. A major initiative to reduce overall electricity consumption has been the drive to increase the efficiency of light bulbs and reduce the energy wasted in heat. Compact Fluorescent Lights (CFLs) were introduced as part of this initiative. However, while CFLs significantly reduce the electricity consumption compared with an equivalent (lumens) lighting level of incandescent bulbs, they have drawbacks such as the "warm up" time they require before producing their full light output, the harsh/cold (spectrally deficient) light they emit, and the use of toxic mercury in the manufacturing process causing environmental handling and disposal problems.

More recently, semiconductor light emitting diode (LED) based lights have been introduced. While LED light bulbs are currently more expensive than incandescent or CFL bulbs, they have much longer operating lifetimes. LED light bulbs have typical operational lifetimes of 30,000 hours or more, compared with CFLs at around 8,000 hours and incandescent light bulbs at around 1,000 hours.

The initial adoption of LED light bulbs has been slow due to their high price as a result of costly manufacturing (passed on to consumers) when compared to incandescent and CFL bulbs, and the expensive and complex thermal management components required to dissipate the heat generated and maintain the electronic components in the bulb within their operational range. In particular, unlike the filaments in incandescent bulbs or the electrodes in CFL bulbs, LEDs are manufactured using a semiconductor fabrication process. However, LED light bulbs are typically assembled in the same manner as incandescent and CFL light bulbs and these processes are not well suited to the assembly processes usually employed for printed circuit board (PCB) assemblies such as those used in high volume consumer electronics and the like. For instance, typical LED based bulb implementations frequently use simple insulated attachment wires to interconnect the LED driver control electronics, typically mounted on a standard but separate PCB, to the LEDs associated with the illumination functions of the bulb, which are typically mounted on a separate thermally efficient PCB. This connectivity method is highly inefficient, potentially unreliable, labor intensive, and an impediment to automated assembly.

Moreover, like all semiconductor devices, LEDs generate significant heat during operation, and will eventually be damaged or destroyed if the heat buildup is not constrained. LEDs are relatively small die area devices, and driven by relatively high current loads to produce the light output required. This leads to high point-source heat generation from the LEDs, and poses severe heat dissipation issues. Additional electronic and semiconductor components are required to control the power supply and drive current to the LEDs. These components also generate heat and need to be temperature controlled. Further, as the LED temperature increases, both its light output (lumens) for a given electrical current and its operating lifetime are significantly reduced. Therefore, it is paramount that the LEDs are adequately cooled.

Minimization of heat has never been a major focus in incandescent or CFL lighting since heat has always been a byproduct of the light generation process. Domestic and commercial electrical light fittings have simply been designed to deal with the heat generated by these bulbs. However, when considering integrating additional high technology capabilities into a light bulb using semiconductors, for instance, heat becomes of paramount concern. Those of ordinary skill in the art will recognize that heat is one of the key enemies in the construction of high density, small form factor, high technology electronics products.

Typically, early generation LEDs used in LED-based lights were either inefficient and/or chosen for the lowest possible cost, and therefore they generated significant heat. Hence, LED bulbs typically required large expensive heatsinks and complex thermal management to dissipate the heat generated to maintain the electronic components in the bulb within their operational range. Such heatsinks are mounted on the exterior of the bulb near the base, rendering this area unusable for illumination from the bulb. This then reduces the overall illumination effect of the bulb, especially when the bulb is required to replicate the broad, even, spherical radiated light pattern of an incandescent light bulb. This also tends to make LED bulbs less aesthetically appealing and much heavier than the bulbs they replace, and in some case makes them unsuitable for some existing lighting enclosures and fittings.

In order to produce an optimal semiconductor LED based bulb, as well as an LED bulb which can wirelessly communicate with a remote entity (also referred to herein as a "LED smart bulb," "intelligent wireless LED light bulb," or "smart bulb"), which meets the goal of easy assembly in mass quantities using automated robotic assembly techniques, and the use of more cost effective design and materials that result in a closer resemblance, both in terms of illumination pattern and physical appearance, to the incandescent light bulb, a different approach is required.

These and other limitations are solved by the present disclosure in the manner described below.

SUMMARY OF THE DISCLOSURE

The present subject matter is generally directed to mechanical and electrical techniques to construct any type of LED light bulb. This is applicable to both a standard (incandescent or CFL replacement) LED bulb, or alternatively a LED smart bulb.

In one embodiment, the LED bulb or LED smart bulb construction uses high volume consumer electronic assembly processes to reduce the assembly and production costs. In another embodiment, the LED bulb or LED smart bulb construction uses state-of-the art materials, combined with mechanical and electrical fabrication technology, in order to both enhance the thermal performance of the bulb, and to allow for robotic handling during assembly and testing of the bulb sub-assemblies, as well as the completed bulb.

In another embodiment, innovative heatsink and thermal management techniques are employed to overcome the large, heavy, and inefficient heatsinks employed in typical LED bulbs. In addition, a modular heatsink extension is disclosed, which allows additional heat dissipation to be provided for higher wattage bulbs while retaining the fundamental objectives of the original design.

In yet another embodiment, mechanical and optical orientation of the LEDs is utilized in order to overcome the inability of LED light bulbs to mimic the optical performance and appearance of an incandescent bulb.

In another embodiment, thermal and electrical innovations are disclosed to allow the temperature of the LEDs to be controlled, while minimizing the parts count required and facilitating automated assembly.

Another embodiment uses short length fixed or flexible mechanically robust connectors to electrically connect the LED driver control electronics (typically located on a standard but separate PCB) to the LEDs associated with the illumination functions of the bulb (typically mounted on a separate thermally efficient PCB), which increases reliability and facilitates automated assembly.

Another embodiment includes mechanical and materials innovations to allow the design to be compliant with national and international regulatory approvals for such things as physical and electrical safety, radio frequency emissions, as well as energy conservation and recycling mandates.

In another embodiment, the LED smart bulb takes advantage of the presence of integrated communications within mobile/cellular handsets, as well as other mobile (such as notebook, tablet, and laptop) and desktop computing devices. Such devices include native wireless communications capabilities such as 802.11/Wi-Fi, Bluetooth, Near Field Communications (NFC), and other wireless technologies to provide local (close physical/geographic distance) communications, typically within about a 100 m radius.

In another embodiment, the LED smart bulb uses the widespread availability and cost effectiveness of wireless technology such as Bluetooth 4.0, also known as Bluetooth Smart and/or Bluetooth Low Energy (BLE), or other wireless networking technology, to integrate this communications capability directly. Since the LED bulb offers a substantially increased lifetime, the incremental cost of the integrated intelligence and communications can be amortized over a much longer lifespan, something not possible in incandescent or CFL bulbs. This allows each LED smart bulb to be individually addressed, controlled, and monitored wirelessly, from a conventional mainstream computing and communications platform, such as a cellular or mobile smart phone, tablet, laptop, or desktop computer running a software application. Further, the availability of low-cost and high volume standardized hardware platforms, allows software applications ("Apps") to be developed to control these individually addressable light bulbs using common and intuitive user interfaces.

BRIEF DESCRIPTION OF DRAWINGS

FIG. 8A through FIG. 8L show illustrative diagrams of the basic assembly steps to manufacture an embodiment of an LED bulb or LED smart bulb.

FIGS. 12A and 12C are illustrative diagrams of an LED smart bulb showing alternate main PCB and LED MCPCB interconnect examples; FIG. 12B is an exploded view of the illustrative diagram of an LED smart bulb in reference to FIG. 12A; FIG. 12D is an exploded view of the illustrative diagram of an LED smart bulb in reference to FIG. 12C.

FIGS. 13A, 13B, and 13C are illustrative diagrams of an LED flexible PCB circuit and modified heatsink collar.

DETAILED DESCRIPTION

Figure 1:
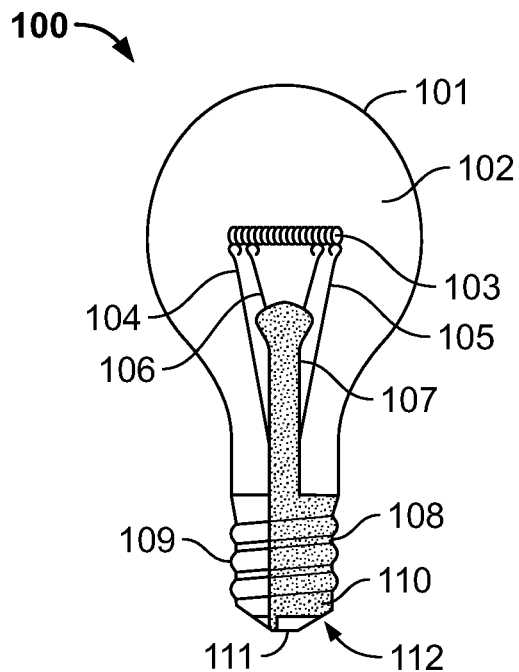
FIG. 1 is an illustrative example of the construction of an incandescent bulb.

To provide an overall understanding of the innovative aspects of the subject matter, certain illustrative embodiments are described; however, one of ordinary skill in the art would understand that the embodiments described herein may be adapted and modified as is appropriate for the specific application being addressed, and that alternative implementations may be employed to better serve other specific applications, and that such additions and modifications will not depart from the overall scope hereof.

In the following detailed description, terminology had been adopted to describe aspects of the disclosure. Since this disclosure defines a new class of lighting product, some new terms and phrases have been defined, such that a consistent nomenclature is used throughout this description. Other descriptive terms and phrases are used to convey a generally agreed upon meaning to those of ordinary skill in the art, unless a different definition is given in this specification. The following paragraphs identify these terms for clarity.

The term "LED" generally refers to semiconductor diode devices that emit non-coherent light in the visible spectrum, and are encased in a polymer package. However, it also includes other semiconductor diode devices that emit light, whether in the visible, infrared or ultraviolet spectrum, and whether coherent or non-coherent. It also includes LED devices that use various phosphors or other chemicals to modify the spectral output of the emitted light, are not encased in a polymer package, or may be groups or arrays of multiple individual LED devices mounted in a single package or on a substrate.

The term "wireless" generally refers to a through-the-air, communications system, which is bidirectional, and can be master slave or peer-to-peer. While one embodiment described is based on the Bluetooth Low Energy (BLE) protocol (also known as Bluetooth 4.0 or Bluetooth Smart), other wireless communications or networking protocol could be substituted such as (but not limited to) 802.11/Wi-Fi, ZigBee, Z-Wave, Insteon, etc.

The term "LED bulb" generally refers to a standard LED light bulb, designed to replace an existing incandescent or CFL bulb, and fits into a domestic or commercial lighting fixture or free-standing luminaire. While one embodiment refers to a form factor typical for an A19 incandescent bulb replacement, other form factors may clearly be developed using the techniques described herein.

The terms "intelligent wireless LED light bulb," "LED smart bulb," and "smart bulb" are used interchangeably to generally refer to a light bulb with an LED based illumination source, which also incorporates intelligence in the form of a microprocessor or microcontroller running a software or firmware based program, and also incorporating a wireless communications capability, such that one or more functions of the bulb can be remotely controlled via said wireless communications path. While not required, the intelligent wireless LED light bulb may also incorporate other communications capabilities such as (but not limited to) Ethernet over powerline, and/or sensors/transducers that operate in the audio, infrared or ultrasonic spectrum. While the one embodiment refers to an LED smart bulb with a form factor typical for an A19 incandescent bulb replacement, other form factors may clearly be developed using the techniques described herein.

In the US, traditional "A" series bulbs typically have an Edison E26 (26 mm diameter) screw base. In Europe, typically "A" series bulbs have an Edison E27 (27 mm diameter), screw base, which is interchangeable with the E26, or uses a different bayonet cap B22 (22 mm diameter) base, with two lugs which retains the bulb in a sprung socket. The most popular variant is the A19 bulb, which is pear shaped, and takes its designated name from the number of eights in inches at its diameter at its widest part, hence 19/8 inches (2⅜ inches), denotes the A19 bulb. The bulb is approximately 4⅜ inches in length. A60 is the metric equivalent version in Europe with the widest part at 60 mm and a length of 110 mm.

The most popular connection for bulbs is the E26 (and its European counterparts) for residential and commercial applications. Many other bulb form factors also use the E26 connector. For instance, the A15 bulb is 15/8 inches (1⅞ inches, or 48 mm) at its widest point, slightly smaller than A19 bulbs and typically used in applications such as appliances, signage and decorative lighting. The T10 is a tubular bulb, with a diameter of 10/8 inches (1¼ inches), typically used for exit signs, showcases, picture lights, and illuminated display units.

PAR (Parabolic Aluminized Reflector) bulbs also use the E26 connector. They are available in 20, 30 and 38 versions. PAR20 denotes, the exact measurement from brim to brim of the reflector, that is to say, 20/8 inches in diameter (2½ inches, approximately 64 mm). PAR30 denotes, 30/8 inches for the reflector diameter (3¾ inches, approximately 95 mm). PAR38 denotes 38/8 inches for the reflector diameter (4¾ inches, approximately 120 mm). These are typically used for "spot-light" effects, which provides a beam spread that is typically lower than 45° and directs a focused beam of light on an object such as in track lighting, illuminating artwork, recessed lighting, or outdoor security lighting.

R (Reflector) or BR (Bulged Reflector) bulbs also use the E26 connector. They are available in 20, 30 and 40 versions. BR20 denotes, the exact measurement from brim to brim of the reflector, that is to say, 20/8 inches in diameter (2½ inches, approximately 64 min). BR30 denotes, 30/8 inches for the reflector diameter (3¾ inches, approximately 95 mm). BR40 denotes 40/8 inches for the reflector diameter (5 inches, approximately 127 mm). These are typically used for "wide-light" effects, which provides a beam spread that typically more than 45° (typically 120°) and emits a broad pattern of ambient light such as in a hallway, kitchen, or recessed lighting.

Recessed lights, and also called recessed downlights or "pot lights" are a special lighting case, where the bulb is placed in a recessed metal can, that is typically mounted above the ceiling and fits flush to the ceiling finish, and a decorative trim is used to finish the overall lighting feature. Often the BR and PAR bulbs work best in recessed downlights as they can be customized to provide the optimal wide-light or spot-light illumination, and often use lenses, diffusers, baffles and eye-ball fixtures. Primarily E26 connectors are used in the recessed can, where the bulb is connected directly within the recessed can, or alternately a proprietary lighting module that fits in the can, is provided with a "pigtail" or flying lead, and terminates in an E26 connector which instead connects to the recessed can (or typically an alternative stationary housing).

MR (Multifaceted Reflector) were originally developed as a halogen light bulb, and utilize the GU4 (bi-pin, 4 mm pitch), GU5.3 (2 pin, 5.3 mm pitch) and the GU10 (bi-pin bayonet, 10 mm pitch) connectors. MR lamp bulbs are predominantly available in 8, 11, 16 and 20 versions. Again, the number denotes the exact measurement from brim to brim of the reflector. For example, MR16 indicates 16/8 inches for the reflector diameter (2 inches, approximately 51 mm), and MR20 denotes 20/8 inches for the reflector diameter (2½ inches, approximately 64 mm). MR lamps are available for operation on 12/24 V AC/DC or 120 V AC. The MR8 and MR11 are only 12/24 V and utilize the GU4 connector, but the MR16 and MR20 are available for both voltages and are available with GU5.3 and GU10 connectors. These are available in various beam configurations, typically used for "spot-light" effects, which provides a focused narrow beam of light on an object and are used in applications such as track lighting, illuminating artwork, or outdoor landscape lighting.

Other versions of Edison connectors are available and used for specialty applications. For instance, the E12 (12 mm) is utilized in the US, commonly used for decorative, candelabra light bulbs. With a smaller screw base, more decorative and compact form factors can be achieved in elaborate ceiling and chandelier lighting fixtures. Typically, wattage ratings for incandescent E12 bulbs are typically 40 W or less, and primarily used where accent or decorative lighting effects are desired, such as wall sconces, lanterns, outdoor fixtures, night lights, and outdoor decorations (such as small C7 type Christmas lights). The E11 (11 mm) European version is also available but it is not compatible with the E12.

The E14 (14 mm) in Europe and the E17 (17 mm) in US are referred to as intermediate form factors. The E14 applications are generally for 240 V AC applications. The E17 version is popularly used in the US for outdoor decorations (such as larger C9 type Christmas lights).

The Mogul E39 (39 mm) US and Goliath E40 (40 mm) Europe versions, are used for high power lamps, typically from 100 W to 300 W.

Referring to FIG. 1, a domestic/household and/or commercial incandescent light bulb (100) is shown. It comprises an air-tight glass bulb (101), filled with low pressure inert gas (102). A tungsten filament (103) inside the glass bulb (101) is connected via contact wires (104, 105), through which an electric current is passed. The tungsten filament (103) and contact wires (104, 105) are also mechanically assisted by support wires (106), anchored into, and electrically isolated by, the glass stem (107). Contact wires (104 and 105) connect the tungsten filament (103) to the base (112) of the bulb. The base (112) is the mechanical and electrical interface with the lighting receptacle in which the bulb will be housed during operation. The base (112) consists of the metallic cap or sleeve (109), insulation (110), the cap electrical contact (108) and the tip electrical contact (111).

The base (112) will have at least two conductors to provide the electrical connections to the tungsten filament (103). The bottom of the glass stem (107) is fused with an air-tight seal to the bottom of the glass bulb (101), and anchored to the bulb's base (112), to allow the electrical contacts (108 and 111) to run through the glass stem (107) without air or gas leaks.

The bulb is filled with a low pressure inert gas (102) or gas mixture to reduce evaporation and oxidation of the tungsten filament (103), for instance argon (93%) and nitrogen (7%) at a pressure of approximately 0.7 Atmosphere (atm), although some small form factor bulbs use only a vacuum to protect the tungsten filament (103).

The electric current heats the tungsten filament (103) to typically 2,000 to 3,300 K (3,140 to 5,480° F.), well below tungsten's melting point of 3,695 K (6,191° F.). Filament (103) temperatures depend on the filament type, shape, size, and amount of current drawn. The heated filament emits light that approximates a continuous spectrum. The useful part of the emitted energy is visible light; however, most energy is given off as heat in the near-infrared wavelengths, and is responsible for the poor efficiency in terms of the direct conversion of electricity to light.

Note that other versions of bulbs may have more than one filament (103), requiring additional electrical contacts on the base (112). For instance, three way bulbs have two filaments and three conducting contacts in their bases. The filaments share a common ground, and can have electrical current applied separately or together. Common wattages include 30/70/100 W, 50/100/150 W, and 100/200/300 W, with the first two numbers referring to the individual filaments, and the third giving the combined wattage.

Most light bulbs have either clear or coated glass. The coated glass bulbs have a white powdery substance on the inside called kaolin. Kaolin, or kaolinite, is white, chalky clay in a very fine powder form that is blown in and electrostatically deposited on the interior of the glass bulb (101). It diffuses the light emitted from the filament (103), producing a more gentle and evenly distributed light. Manufacturers may add pigments to the kaolin to adjust the characteristics of the final light emitted from the bulb. Kaolin diffused bulbs are used extensively in interior lighting because of their comparatively gentle light. Other kinds of colored bulbs are also made, including the various colors used for "party bulbs", Christmas tree lights and other decorative lighting. These are created by staining the glass with a dopant, which is often a metal such as cobalt (blue) or chromium (green). Neodymium-containing glass is sometimes used to provide a more natural-appearing light.

Many arrangements of electrical contacts are used. Large bulbs may have a screw base with one or more contacts at the tip, and one at the shell, such as the combination of 108, 109, 110, and 111. Alternatively, a bayonet base (not shown) may be used, with one or more contacts on the base, with the shell used as a contact or used only as a mechanical support. Some tubular bulbs have an electrical contact at either end. Miniature bulbs may have a wedge base and wire contacts, and some automotive and special purpose bulbs have screw terminals for connection to wires. Contacts in the lamp socket allow the electric current to pass through the base to the filament (103). Power ratings for incandescent light bulbs range from about 0.1 watt to about 10,000 watts.

The glass bulb of an incandescent bulb can reach temperatures between 200 and 260° C. (392 and 500° F.). Lamps intended for high power operation or used for heating purposes have envelopes made of hard glass or fused quartz.

The primary problem with incandescent light bulbs is that they are very inefficient, and waste substantial electrical energy in the form of heat. Since heat is not light, and the purpose of the light bulb is light, all of the energy spent generating heat is wasted. Light is measured in units called "lumens," which correspond to the amount of light produced per watt of input power. For a source of light to be 100% efficient, it would theoretically need to generate approximately 680 lumens per watt (lumens/W). The luminous efficiency of a conventional incandescent bulb is in the range of 1.9-2.6%. Alternatively, an incandescent bulb produces around 15 lumens/W of input power.

In many regions, regulations require manufacturers to list both the lumens produced as well as the watts used by every bulb, so luminous efficiency can be calculated easily.

Standard fluorescent tubes are well known and have been in use for many years. The long tubular shape and the external "ballast" and "starter" circuits have been widely used due to their more efficient use of electricity. However, the long tubular form factor, and their harsh and often flickering light output has limited their acceptance primarily to large commercial and industrial installations. The compact fluorescent light (CFL) essentially takes the same long glass tubular structure and bends it in on itself (hence "compacts" it) to essentially make it capable of fitting into the standard domestic household receptacle, originally designed for an incandescent bulb. Early CFL versions still exhibited the same limitations as standard fluorescent tubes, namely, harsh light, flickering, unable to be dimmed, and require warm-up time.

Figure 2A:
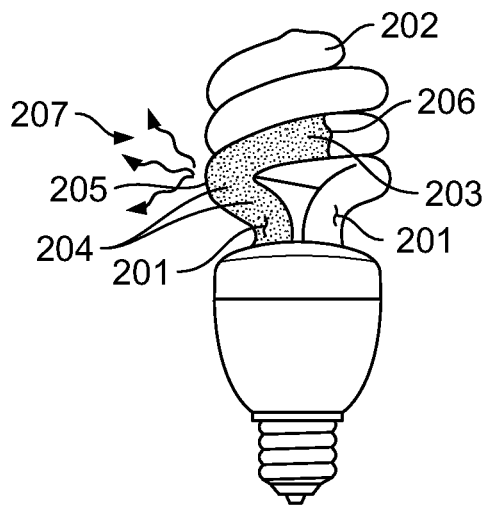
FIGS. 2A and 2B show illustrative examples of the construction of a CFL bulb.
Figure 2B:
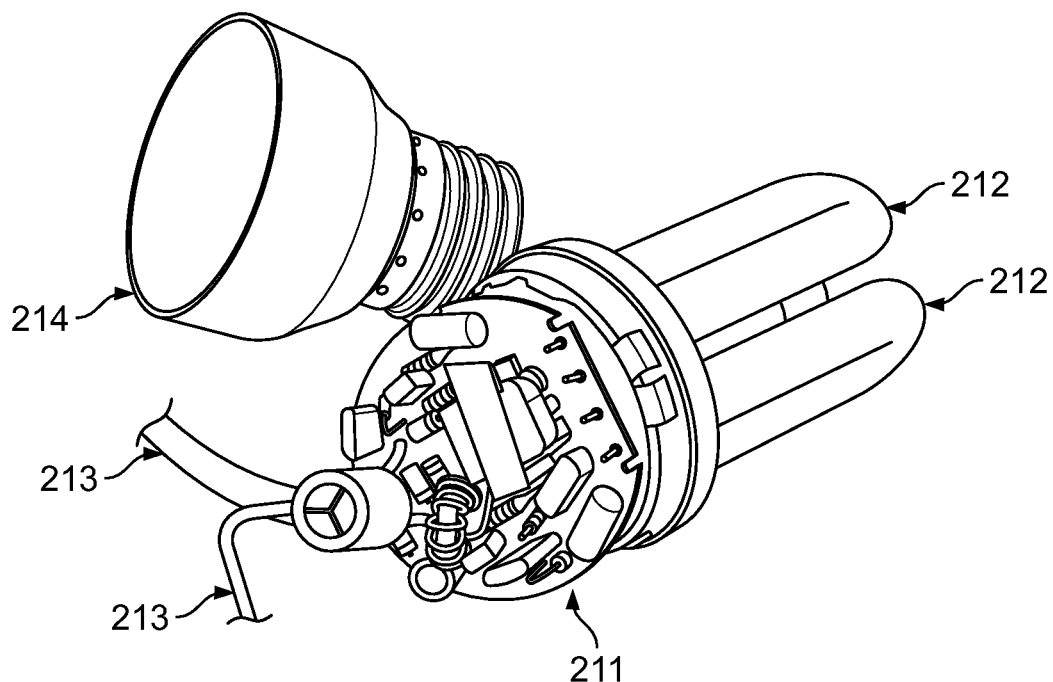

Referring to FIG. 2A and FIG. 2B, the conventional construction of a compact fluorescent light (CFL) is shown. While there are many different form factors of CFLs, the construction is generally the same. The glass tube is heated and bent, typically using a spiral pattern (202), as show in FIG. 2A, or a series of tubes in the form of U-bends (212), as shown in FIG. 2B, to form a compacted shape. An electronic self-ballast and starter circuit (211) is built into the base of the bulb (214), so there are no external components, and the unit is self-contained. The base of the bulb (214) is shown removed, exposing the electronic self-ballast and starter circuit (211) and the connecting wires (213).

A fluorescent bulb uses a completely different method to produce light. Referring to FIG. 2A, electrodes (201) are present at both ends of the glass bulb (202) that forms the fluorescent tube. Inside the glass bulb (202) is a special gas (203), a mixture of a noble gas (argon, xenon, neon, or krypton), and mercury vapor. With an electric current applied across the electrodes (201), a stream of electrons (204) flows through the special gas (203) from one electrode (201) to the other. These electrons (204) collide with the mercury atoms and excite them, forcing them to a higher energy (but unstable) state. As the mercury atoms move from the excited state back to the unexcited state, they give off photons of light in the ultraviolet region of the spectrum (205). These photons strike the phosphor coating (206) on the inside of the glass bulb (202), and the phosphor fluoresces to produce light in the visible spectrum (207).

A fluorescent bulb produces less heat, so it is much more efficient than the incandescent bulb, between 9-11% efficiency for most CFLs, or in the range of 50-100 lumens/W. This makes fluorescent bulbs 4-6 times more efficient than incandescent bulbs. Therefore, a typical 15 watt fluorescent bulb will produce the same amount of light as a 60 watt incandescent bulb. The mercury atoms in the fluorescent tube must be ionized before the arc can "strike" within the tube. For small bulbs, it does not take much voltage to strike the arc and starting the bulb presents no problem, but larger tubes require a substantial voltage (in the range of a thousand volts), and so "starter" circuits are required to generate the high initial strike voltage.

Fluorescent bulbs are negative differential resistance devices, so as current flow increases through the tube, the electrical resistance drops, allowing even more current to flow. If connected directly to a constant-voltage power supply, a fluorescent bulb would rapidly self-destruct due to the uncontrolled current flow. To prevent this, fluorescent bulbs require an auxiliary device, a ballast, to regulate the current flow through the tube.

The terminal voltage across an operating fluorescent tube varies depending on the arc current, tube diameter, temperature, and fill gas. The simplest ballast for alternating current (AC) uses an inductor placed in series, consisting of a winding on a laminated magnetic core. The inductance of this winding limits the current flow. Ballasts are rated for the size of tube and power frequency. Where the AC voltage is insufficient to start long fluorescent bulbs, the ballast is often a step-up autotransformer with substantial leakage inductance (so as to limit the current flow). Either form of inductive ballast may also include a capacitor for power factor correction.

Many different circuits have been used to operate fluorescent bulbs. The choice of circuit is based on AC voltage, tube length, initial cost, long term cost, instant versus non-instant starting, temperature ranges and parts availability, etc.

While the efficiency of CFLs significantly higher than with incandescent bulbs, there are several drawbacks. Construction complexity is significantly higher. The straight glass tubes must be heated and bent into the compacted form, a process that was initially manual, although capitally intensive automation has been applied to the manufacture of some tubes. There are additional steps to heat and coat the inside of the glass tube with the phosphor coating, as well as injecting the special gas fill and sealing the electrodes at each end of the tube. Since the mercury used in the gas fill is classified as hazardous, this requires special handling in the manufacturing process. The ballast and starter electronics require the addition of a circuit board, and final assembly of all the parts is largely manual.

From a user and legislative perspective, the residual mercury in CFLs is a significant issue. Safe disposal of old bulbs, although regulated in most geographic regions, remains a problem. Breakage of bulbs in any household or public space is also becoming much more problematic as increased environmental regulations are imposed. Many people do not like the time the CFL bulb takes to warm up and generate its full light output, and dislike the cold appearance of the created light, due to the difference in light spectrum versus an incandescent bulb. Light flicker due to the AC supply, and the inability to dim the CFL, and poor "cold start" performance issues in cold climates, are also cited as drawbacks. However, flicker free, fast start, cold-start and dimmable CFLs are becoming available, albeit at slight higher costs.

Light Emitting Diode (LED) based bulbs offer significant advantages over either CFL or incandescent bulbs. Compared to CFLs, advantages of LED-based light bulbs are that they contain no mercury (unlike a CFL), turn on instantly, and are not affected by cold temperatures. Their lifetime is unaffected by cycling on and off, so that they are well suited for light fixtures where bulbs are frequently turned on and off. LED light bulbs are also mechanically robust, while most other artificial light sources are fragile.

The electrical efficiency of LED devices continues to improve, with some LED chips able to emit substantially more than 100 lumens/W. However, since the individual LEDs operate at significantly reduced voltage and current compared with incandescent and compact fluorescent bulbs, the light output of an individual LED is typically small, so most lighting applications require multiple LEDs to be assembled.

Figure 3A:
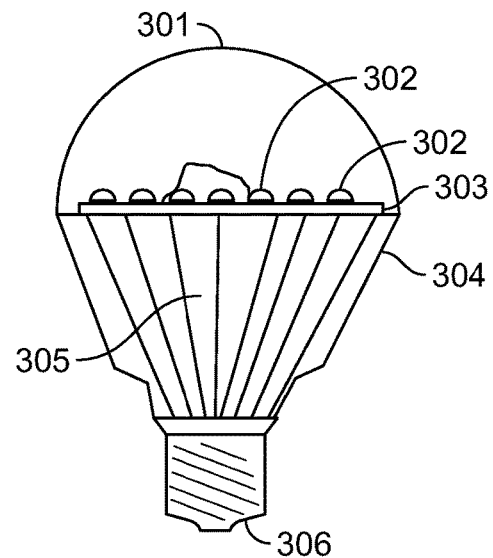
FIGS. 3A and 3B show illustrative examples of the construction of a LED bulb.

Referring to FIG. 3A, the construction of a basic LED bulb is shown. Typically, a plastic dome (301) or diffuser encases the LED array (302), mounted on a thermally efficient PCB substrate (303). Since LEDs perform optimally using direct current (DC) electrical power, the bulb incorporates an internal rectifier circuit (305) to provide a regulated DC output at low voltage, from the standard AC power. LEDs are degraded or damaged by operating at high temperatures, so LED bulbs typically include heat dissipation elements such as the thermally efficient PCB (303), mechanically and thermally attached to large external heatsinks (304) which may incorporate additional cooling fins. LED bulbs are made to replace standard incandescent or CFL bulbs, using standard electrical fittings such as, but not limited to, the E26 base (306).

A significant feature of LEDs is that the light is directional, as opposed to incandescent bulbs, which spread the light more spherically. This is an advantage with recessed lighting or under-cabinet lighting, but is a disadvantage for table lamps, or other applications that require an omni-directional lighting pattern.

Figure 3B:
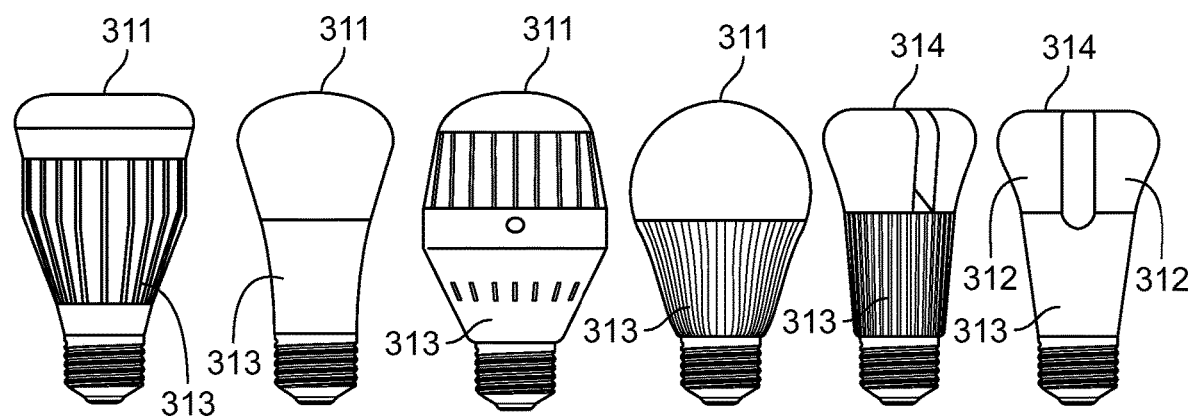

FIG. 3B shows a selection of consumer LED bulbs available as direct replacements for incandescent bulbs, in screw-type sockets. The directional lighting characteristics of LEDs affect the design of LED-based bulbs. Some LED bulb designs address the directional limitation by using plastic or glass diffuser lenses (311) and internal reflectors to disperse the light more like an incandescent bulb. In some cases, distributed LED arrays (312) are mounted on separate PCBs facing in different directions in an attempt to generate a more spherical light distribution pattern.

Currently, inefficient designs and legacy assembly techniques continue to overcomplicate the construction and final assembly of LED bulbs, requiring the use of a combination of screws, fasteners, glues, potting compounds and interconnects.

With correctly designed LED driver electronics, LED bulbs can be made fully dimmable over a wide range.

The main difference to other light sources is the directed light. Thus illuminating a flat defined area requires less lumens compared with a light source, which would need reflectors or lenses to do the same. For illuminating a 360° orbit, the benefits of LEDs are much smaller. LED bulbs are used for both general and special-purpose lighting. Where colored light is needed, LEDs naturally emitting many colors are available with no need for filters. This improves the energy efficiency over a white light source that generates all colors of light then discards some of the visible energy in a filter. In some cases, colored phosphorescent lenses (314) may be used over the LEDs, to convert a colored LED to white light, using the phosphorescence feature to further enhance the spatial effect of the light emitted.

White-light LED bulbs have longer life expectancy and higher performance than most other lighting alternatives. LED sources are compact, which gives flexibility in designing lighting fixtures and good control over the distribution of light with small reflectors or lenses. Because of the small size of LEDs, control of the spatial distribution of illumination is flexible, and the light output and spatial distribution of a LED array can be controlled with no efficiency loss.

Most LED bulbs replace incandescent bulbs rated from 5 to 60 watts. As of 2010, some LED bulbs have been produced to replace higher wattage bulbs, such as 100 watts. Regional legislation in the EEC, US and other countries has already outlawed the sale of many types of incandescent bulbs. In the US, the sale of standard household incandescent bulbs is being phased out, with 100 W incandescent bulbs obsoleted from Jan. 1, 2012; 75 W incandescent bulbs obsoleted from Jan. 1, 2013; and 40 W and 60 W incandescent bulbs obsoleted from Jan. 1, 2014.

Some models of LED bulbs work with dimmers as used for incandescent bulbs. The bulbs have declined in cost to between US$10 to $50 each as of 2012. They are more power-efficient than CFL bulbs and offer lifespans of 30,000-50,000 hours (reduced if operated at a higher temperature than specified). LED bulbs maintain light output intensity well over their life-times. Energy Star specifications require the bulbs to typically drop less than 10% after 6,000 or more hours of operation, and in the worst case not more than 15%. They are also mercury-free, unlike CFLs. LED bulbs are available with a variety of color properties. The higher purchase cost versus other bulb types may be more than offset by savings in energy and maintenance.

Despite all of these advantages, cost remains the primary obstacle to consumer adoption. Much of this cost can be attributed to the required construction. Large external heatsinks (304, 313) are necessary to keep the LEDs at their optimal operational temperature; otherwise, the lifetime is significantly shortened. These heatsinks (304, 313) also make the bulbs heavy, and may require air flow around them, limiting their use in some applications. Multiple LED arrays are mounted on separate PCBs, in an attempt to make the lighting mimic the spherical characteristic of incandescent bulbs. This increases the number of internal connections between the power supply electronics and the LED PCB. Finally, the bulbs are generally assembled using technology common to the bulb manufacturing process, rather than the computer or electronics industry.

Figure 4:
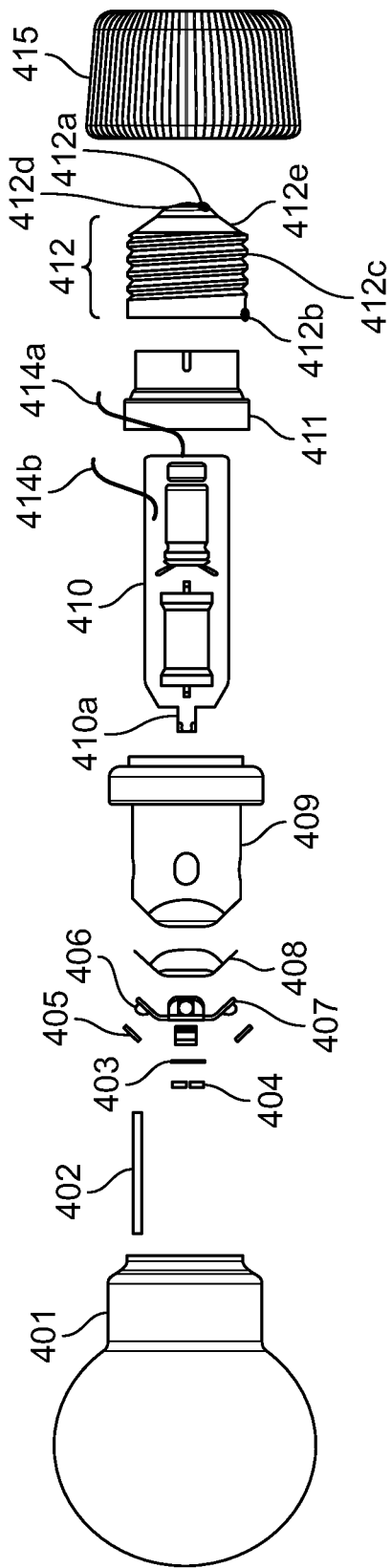
FIG. 4 is an illustrative example of the construction of an LED smart bulb.

Referring to FIG. 4, the individual mechanical components for assembly of an LED bulb or intelligent wireless LED light bulb are shown. Glass bulb (401) seats upon the rim of the heatsink collar (409), and encases the antenna (402), Kapton tape (403), board-to-board connectors (404), the LED rings (405), the LEDs (406), the LED MCPCB (407) and the double-sided thermal adhesive tape (408). The glass (or plastic) bulb (401) covers a substantial area of the heatsink collar (409). Only the lower rim of the heatsink collar (409), where the glass bulb (401) is actually seated, remains exposed after assembly. This feature minimizes the potentially hot exposed surface area of the heatsink collar (409), and significantly reduces the burn hazard to a person when unscrewing such an embodiment of the LED smart bulb, compared with prior art LED bulb designs. In addition, thermal epoxy (or similar) adhesive is used to connect the glass bulb (401) to the heatsink collar (409), which makes the glass bulb (401) an extension of the overall heatsink collar (409) for enhanced thermal management. Since the overall heat dissipation of the LEDs is only approximately 6 W, for a light output equivalent to a 40 W rated incandescent bulb, the burn hazard due to inadvertent contact with this LED smart bulb embodiment is further mitigated.

In order to control high point-source heat dissipation from LED lighting and other high power semiconductor technologies, new materials and processes have been developed, such as Metal Core PCB (MCPCB) technology. This uses a metal layer within the PCB to move heat more rapidly away from the components.

The LED metal-core printed circuit board (MCPCB) (407), is attached via thermal adhesive tape (408) to the heatsink collar (409), which acts as a heat sink dissipating the heat generated by the LEDs (406) when illuminated. Heat is conducted through the LED MCPCB (407), via the thermal adhesive tape (408) to the heatsink collar (409) and the glass bulb (401), where it is dissipated by convection and radiation. The use of the thermal adhesive tape (408) eliminates the need for any other mechanical connection between the LED MCPCB (407) and the heatsink collar (409), such as screws, fasteners, etc., and allows a smaller LED MCPCB (407) to be utilized.

The board-to-board connectors (404) provide the electrical connectivity between the LED MCPCB (407) and the main printed circuit board assembly (410). This allows the LED MCPCB (407) to be mechanically and thermally attached to the heatsink collar (409) using the thermal adhesive tape (408), and then electrically connected by soldering and/or press-fitting the board-to-board connectors (404) in place. The intent is that board-to-board connectors (404) are not flying leads or "pigtail", or some kind of plug and socket connector system, since these add cost and are potentially unreliable due to factors such as shock or vibration. In one embodiment for instance, board-to-board connectors (404) are simple header connector pins, well known in the electronics industry, which are soldered and/or press fitted in place. These header pins are (for instance) soldered to the LED MCPCB (407) at one end. The free end of the header pins are bent up and connected to the contact pads on the tab (410a) extension to the main circuit board assembly (410). In an alternative embodiment, board-to-board connectors (404) could be surface mount device (SMD) zero ohm (0Ω) resistors soldered in place. In a further embodiment, the board-to-board connectors (404) could be flexible jumper strip connectors, well known in the computer laptop, smart phone, and tablet electronics industries. Additional detail is shown in FIG. 12A and FIG. 12B, as well as FIG. 12C and FIG. 12D, and their associated descriptions.

As an additional embodiment, the tab (410a) may provide additional specific connections, such as antenna (402) connection(s). The tab (401a) may provide optional connections to other LED drive functions, such as a single LED circuit chain or separate and/or multiple color LED circuit chains. Additionally, one or more tab(s) (410a) may be provided by the main PCB (410) that segregate different functions, which provide accessible connectivity between the main PCB (410) below, to the MCPCB (407) surface above. Further, the prior connectivity "pigtails" and/or plug and socket connectivity, although more traditional and less desirable as the alternative board-to-board connectors (404), may be mixed with versions of the various connections, and used in conjunction with the tab (410a) connections that are provided from the main PCB (410) and the MCPCB (407).

The Kapton tape (403), or other insulation material, is placed on the LED MCPCB (407), to electrically isolate the board-to-board connectors (404) from the conductive areas of the LED MCPCB (407), and the heatsink collar (409). The board-to-board connectors (404) are placed over the Kapton tape (403) and electrically connect the contact pads of the main circuit board assembly (410) to the LED MCPCB (407) and via its traces to the LEDs (406). In an alternate embodiment, the Kapton tape (404) may be eliminated, if the board-to-board connectors (404) chosen, pose no risk of shorting to the other surrounding electrically conductive areas. In another alternate embodiment, traces can be routed on internal layers of the MCPCB (407).

A separate (optional) LED ring (405) encompasses each LED (406) on the LED MCPCB (407). The LED ring (405) is a small square of ABS plastic (or similar electrical insulating material) designed to fit around the surface mount device (SMD) LED (406) components, which increases the dielectric strength of the LED MCPCB (407), allowing the LED (406) components to be placed at the edge of the LED MCPCB (407). This is important to meet the various relevant regulatory safety requirements that consumer electrical products must pass to be sold, such as electrical isolation requirements for withstand voltage (typically 1500 V). An alternate approach to enhance electrical isolation is shown in FIG. 10 and its accompanying description.

In the example shown, four LEDs (406) are mounted on the LED MCPCB (407), one on each of the angled tabs or "wings" of the formed LED MCPCB (407). The tabs on the LED MCPCB (407) are bent during manufacture such that when the LEDs (406) are soldered down they are positioned to form a wide angle cone of light to be dispersed from the glass bulb (401). This enables fewer LEDs (406) to be utilized and allows a radiated light pattern more similar to the incandescent bulb, as opposed to the very narrow focused beam of early LED bulbs that typically use an array of LEDs all mounted on a flat substrate in the same plane.

Each LED (406) is solder mounted to the LED MCPCB (407), which is attached to the heatsink collar (409) using the thermal adhesive tape (408). The thermal adhesive tape (408) electrically isolates the conductive areas of the LED MCPCB (407) from the heatsink collar (409).

The cylindrical isolation sleeve (411) and the heatsink collar (409) both contain two PCB guide slots on the interior walls of their cylindrical portions. The main circuit board assembly (410) is housed between these slots within the heatsink collar (409) and isolation sleeve (411) interior walls, providing a secure mechanical location for the electronic components necessary for the wireless communications and intelligence of the smart bulb. In an alternate embodiment, the two PCB guide slots may be eliminated from either the heatsink collar (409) or the isolation sleeve (411), such that only one of the two components provides the two PCB guide slots.

The main circuit board assembly (410) integrates the remainder of the electronics. In the case of a standard (incandescent or CFL replacement) LED bulb, this would include the power supply components to provide the low voltage DC supply (typically 24-48 V DC, dependent on the number of LEDs) for the LED driver circuits, derived from the high voltage AC supply of the bulb receptacle (typically 120 V or 240 V AC), and the drive electronics for the LEDs. In the case of an LED smart bulb, the main circuit board assembly (410) would typically include (but not be limited to) a microprocessor, the Bluetooth (or other wireless access method) Medium Access Control (MAC) and Physical (PHY) layers, LED driver, digital to analog converters, power transistors, as well as the power supply components to provide the low voltage DC supply (typically 3.3 V DC) for the integrated circuits, derived from the high voltage AC supply of the bulb receptacle (typically 120 V AC or 240 V AC). The main circuit board assembly (410) has two flying leads or "pigtail" connection wires (414a, 414b) at one end of the board which provide the contacts to the E26 base (412) shown in this example, via the tip electrical contact (412a) and the cap electrical contact (412b). At the opposite end of the main circuit board assembly (410), a small tab protrudes (410a). This tab (410a) passes through a corresponding small slot in the cap of the heatsink collar (409), the thermal adhesive tape (408) and the LED MCPCB (407), and provides the electrical contacts from the main circuit board assembly (410) to the LEDs (406), via the board-to-board connectors (404) and LED MCPCB (407), and also provides the contacts for the antenna (402) for the Bluetooth (or alternate wireless) radio. In this way, the main circuit board assembly (410) and the mating surface of the LED MCPCB (407), are at a 90° angle to each other.

In an additional embodiment, the tab (410a) may or may consist of the antenna (402) connection(s), and/or the LED connections, which allows the antenna (402) to be positioned above the primary MCPCB (407) surface. The antenna connections allow the antenna (402) to be positioned above the surface of the MCPCB (407). An alternative separate slot or additional mechanical clearance of the single slot may accommodate the LED circuit connections from the main PCB (410) to the LEDs (406) located on the MCPCB (407).

In this exemplary embodiment, the main circuit board assembly (410) is primarily associated with the power supply and drive electronics for the LEDs of an LED bulb, and if present, the processing and communications functions to enable an LED smart bulb. The LED MCPCB (407), or alternate high performance thermal circuit board, is primarily associated with the mounting of the LEDs (406) associated with the illumination functions of the LED bulb or LED smart bulb. This is not intended to limit the present disclosure to the disclosed embodiment. A person with skill in the technical areas relating to the present disclosure may extend the concepts by the use of alternate embodiments.

The isolation sleeve (411) is bonded to the E26 base (412) using a thermal epoxy (or similar adhesive) in a continuous or non-continuous coating around the E26 base (412). Alternatively, a mechanical grip or crimp, or a combination of adhesive and crimp, may be used to provide a secure mechanical joint. The E26 base (412) provides both the mechanical interface to the lighting receptacle, which physically houses the smart bulb, as well as the electrical connectivity to the smart bulb main circuit board assembly (410). The E26 base (412) is comprised of the E26 base screw thread (412c), which screws into the electrical receptacle and is electrically connected to the cap electrical contact (412b); the E26 base snap insert (412d) which connects to other terminal in the electrical receptacle and is electrically connected to the tip electrical contact (412a); and the E26 base insulator (412e), which electrically isolates these two connections. The two connection wires (414a and 414b) on the main circuit board assembly (410) are terminated on the tip electrical contact (412a) and the cap electrical contact (412b). An E26 base snap insert (412d) is screwed or press fitted and/or soldered into the E26 base (412), and connects via connection wire (414a) to the voltage rail on the main circuit board assembly (410). Alternatively, a thermal epoxy (or similar adhesive) may be applied to the E26 base snap insert (412d) prior to being fitted to the E26 based.

An optional, external heatsink extension (415) is detailed. This is intended for use where higher power illumination is required, and higher current LEDs and/or larger numbers of LEDs are employed. The external heatsink extension (415) is attached to the exposed exterior edge of the outer ring (909g on FIG. 9 for detail) of the heatsink collar (409), to maximize conduction between the heatsink collar (409) and the heatsink extension (415). The external heatsink extension (415) may be attached to the heatsink collar (409) by a variety of means, including but not limited to, mechanical press fit, thermal epoxy or other thermal adhesive, mechanical fasteners such as set screws or grub screws, or a clamping mechanism. The intention is that the part of the external heatsink extension (415) that covers the lower part (neck) of the glass bulb (401), provides an air gap between the glass bulb (401) and the external heatsink extension (415) to permit air flow to allow both radiation and convection.

Figure 5A:
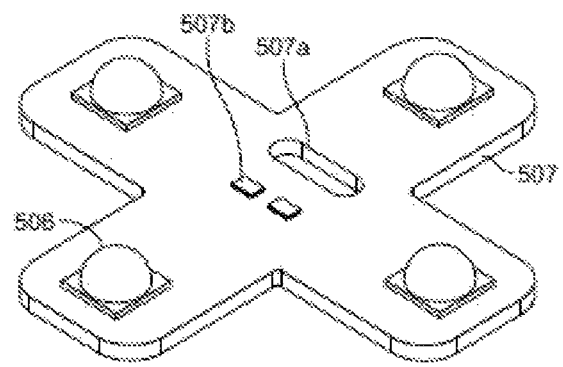
FIGS. 5A, 5B and 5C illustrate examples of the formation of the LED MCPCB for the LED smart bulb.
Figure 5B:
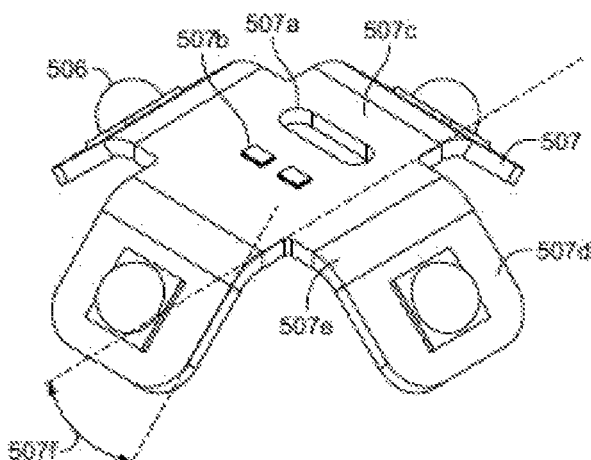
Figure 5C:
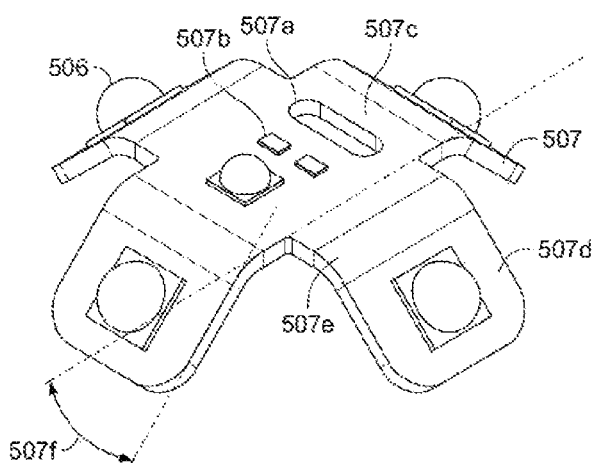

Referring to FIG. 5A, FIG. 5B and FIG. 5C, the formation of the LED MCPCB is detailed. FIG. 5A shows the LED MCPCB (507) prior to bending. LEDs (506) are soldered into their locations prior to bending so that normal surface mount technology (SMT) wave or reflow soldering techniques can be employed. The slot (507a) is where the tab on the main circuit board assembly (not shown, see 410a in FIG. 4 for additional detail) passes through the LED MCPCB (507). The pads (507b) are the connections where the board-to-board connectors (not shown, see 904 in FIG. 9, or 1230 in FIG. 12B for additional detail) are soldered to make the connection between the LED MCPCB (507) and the main circuit board assembly. FIG. 5B shows the LED MCPCB (507) after the bending operation, after which several regions are formed. The flat area (507c), where in one embodiment the slot (507a) for the main circuit board assembly and the pads (507b) for the board-to-board interconnect are present, but in alternate implementations there may be additional connections, components and/or LEDs present in this area, such as shown in FIG. 5C. The four "petals" (507d) or "wings" are where each of the LEDs (506) are mounted in the one embodiment, although a different number of petals (507d) and/or LEDs (506) per petal may be present. In the curve or bend area (507e) between the flat area (507c) and the petals (507d), the solder mask may be removed (for instance, to be replaced by Electroless Nickel Immersion Gold (ENIG) or Hot Air Solder Leveling (HASL), or other surface treatment as applicable), to prevent cracking of the solder mask during the bending process. The bend angle (507f), between the flat area (507c) and the petals (507d), in the one embodiment is 44°, but may be another angle dependent upon the number of petals, and/or the light dispersion characteristics of the LEDs (506). In additional, almost any other bend angle (507f) is possible, including bending the petal (507d) in a downwards direction (as shown) from the flat area (507c), approximately 5° to 90°; or alternatively, bending the petal (507d) in an upwards direction (opposite to that shown) from the flat area (507c), approximately 5° to 90°. In the preferred embodiment, the LED MCPCB (507) is typically V-grove scored or flat-end milled on the underside of the bend area (507e), to ensure the bending takes place in the precise location and that there is clearance such that the material on the inside of the bend, between the flat area (507c) and the petals (507d) will not foul or bind during the bending process.

The MCPCB (507) with the flat area (507c), perpendicular to the main PCB board, can be built with any number of petals (507d) and which can be angled up or down from ±90° angles, including 0°, In the case of a 0° angle, the petals (507d) may be on the same plane as the flat area (507c) surface of the MCPCB (507), and the petals (507d) may or may not be required to be formed, where the flat area (507c) and the petals (507d) are positioned perpendicular to the main PCB and its protruding tab. The protruding tab of the main circuit board (510a), which passes through the slot in the MCPCB (507), provides connectivity traces, at a minimum to allow the main PCB to connect to the antenna, and allows the antenna to be mounted and positioned above the main MCPCB surface. This antenna positioning above the surface of the MCPCB significantly increases the wireless range.

Figure 6A:
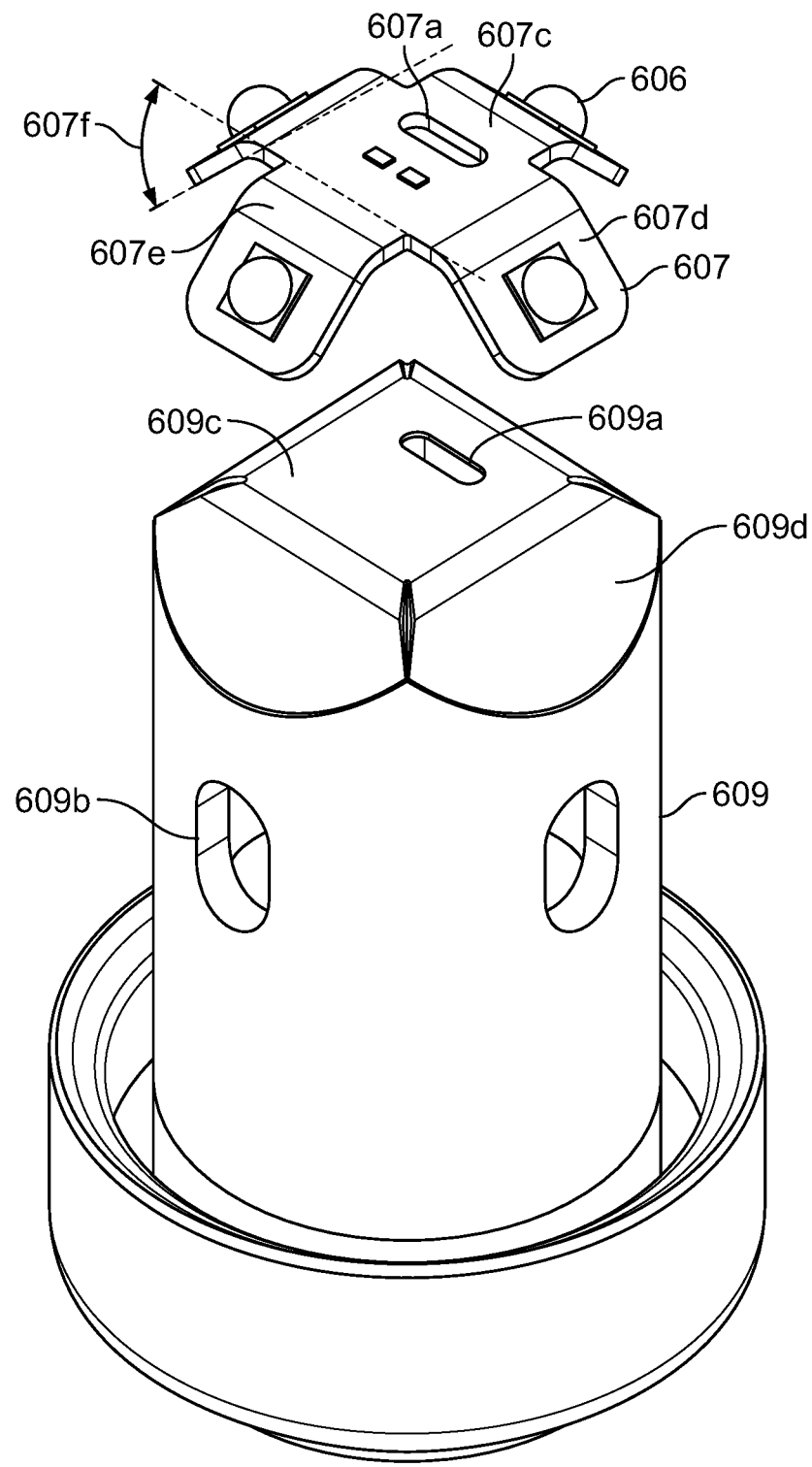
FIGS. 6A and 6B are illustrative diagrams showing the heatsink collar and LED MCPCB for the LED smart bulb.
Figure 6B:
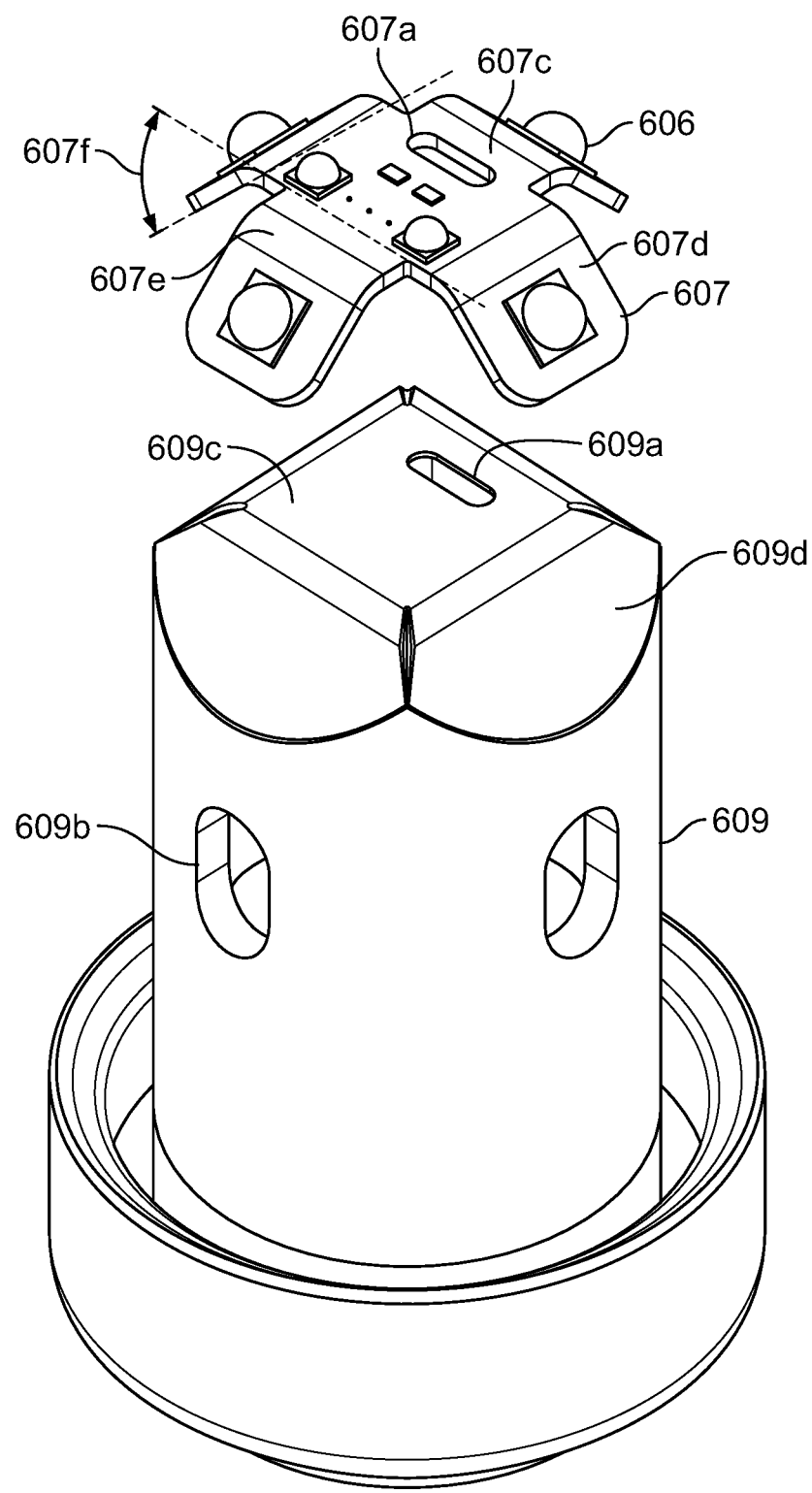

Referring to FIG. 6A and FIG. 6B, the relationship between the LED MCPCB (607) and the heatsink collar (609) is shown. The slot (609a) in the heatsink collar (609) and the slot (607a) in the LED MCPCB (607) are clearly shown. Note that these may be of slightly different sizes, in order to aid alignment of these components during assembly. Additionally, the slot in the thermal tape (not shown, see 908 in FIG. 9, or 1008 in FIG. 10A or 10B for additional detail) which sits between these two components may also be of a different size to further aid assembly alignment. Vent holes (609b) are present on the cylinder wall of the heatsink collar (609).

In order to maximize the rapid thermal transfer from the LEDs (606), it is vital that the fit between the LED MCPCB (607) and the top of the heatsink collar (609) is optimized for precise mechanical alignment. The intent is that the flat area (607*c*) of the LED MCPCB (607) and the corresponding flat area (609*c*) on the heatsink collar (607), as well as the underside of the petals (607*d*) of the LED MCPCB (607) and the angled shoulders (609*d*) of the heatsink collar (609), precisely align to maximize the overall surface contact. This must also take into account the geometry of the interceding double-sided thermal adhesive tape (not shown, see 908 in FIG. 9, or 1008 in FIG. 10A or FIG. 10B) which mechanically and thermally bonds these two entities together. In the one embodiment, thermal adhesive tape of 0.010" thickness is used, however other thicknesses may be employed dependent on the application. Dependent on the thickness of the thermal adhesive tape, or any alternate bonding material, it may be necessary to slightly modify the position of the bend area (607*e*) and/or the bend angle (607*f*) of the LED MCPCB (607) to accommodate a different adhesive material thickness, but still ensure a precise thermal and mechanical fit between the underside of the LED MCPCB (607), the intervening thermal adhesive layer, and the top of the heatsink collar (609). This may also require the scoring or milling on the underside of the bend area (607*e*), to be modified to still ensure the bending takes place in the precise location, and there are no material clearance issues on the inside of the bend, between the flat area (607*c*) and the petals (607*d*).

The thermal adhesive tape may be replaced with a thermal paste and/or adhesive similar compound to maximize the thermal transfer from the MCPCB and the heatsink. Additionally, the manufacturing of the close fit between the MCPCB and the heatsink could allow the mechanical fit between the MCPCB and the heatsink to provide enough heat transfer, which would allow the thermal adhesive and/or paste to be eliminated.

In an alternative embodiment, heatsink (609) and LED MCPCB (607) could be designed to accommodate a plurality of geometric shapes to allow for any number of petals and/or LED configurations. This would result in a heatsink (609) with an alternate shaped flat area (609*c*) and a different number of angled shoulders (609*d*), which would mechanically and thermally interpose with a like shaped LED MCPCB (607), with a corresponding shaped flat area (607*c*) and number of petals (607*d*). The plurality of geometric shapes would be determined by a compromise between manufacturing cost and quality of light output. Coupled with this, as a further embodiment, the bend angle (607*f*) between the flat area (609*c*) and the petals (607*d*) could vary from approximately 5° to 90° in the upwards direction (effectively producing a cylinder with light shining in on itself) to approximately 5° to 90° in the downwards direction (effectively producing a cylinder with light shining completely outwards).

In another alternative embodiment, the MCPCB (607) with the flat area (607*c*), perpendicular to the main PCB board, can be built with any number of petals (607*d*) and which can be angled up or down from ±90° angles, including 0°, In the case of a 0° angle, the petals (607*d*) may be on the same plane as the flat area (607*c*) surface of the MCPCB (607), and the petals (607*d*) may or may not be required to be formed, where the flat area (607*c*) and the petals (607*d*) are positioned perpendicular to the main PCB and its protruding tab. In this case, the heatsink (609) would need to be altered to result in an alternate shape that provided appropriate heat dissipation from the MCPCB 607 to the heatsink (609).

In another alternative embodiment, LED MCPCB (607) could be substituted with another thermally efficient PCB technology, such as a flexible and/or bendable PCB technology, that provides direct contact between the LED (607) package substrate, and the metal heatsink core of the PCB technology.

Figure 7B:
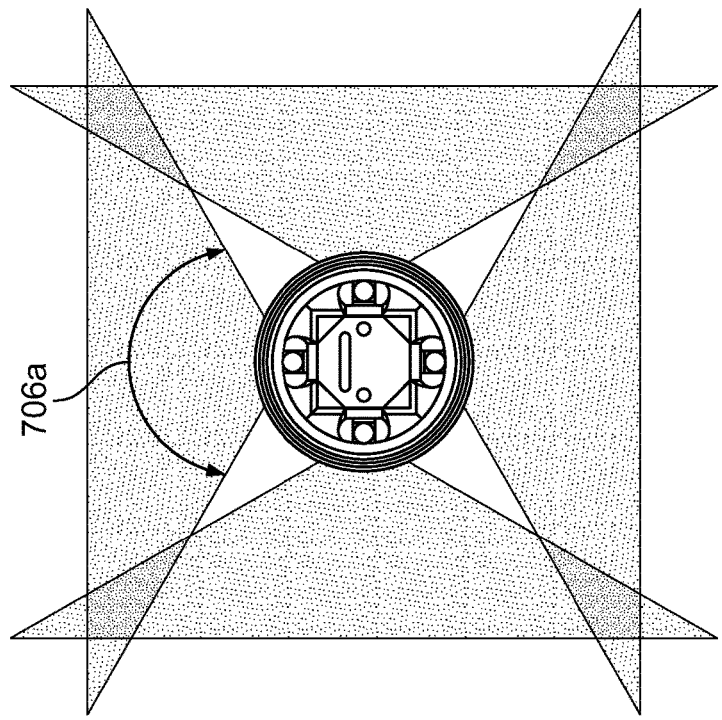
FIGS. 7A, 7B, and 7C show results of an LED illumination simulation analysis.
Figure 7C:
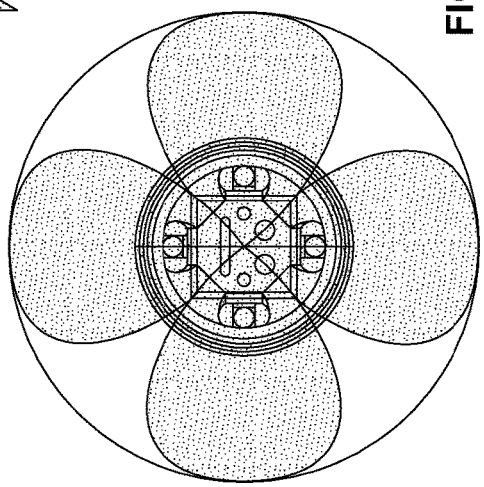
Figure 7A:
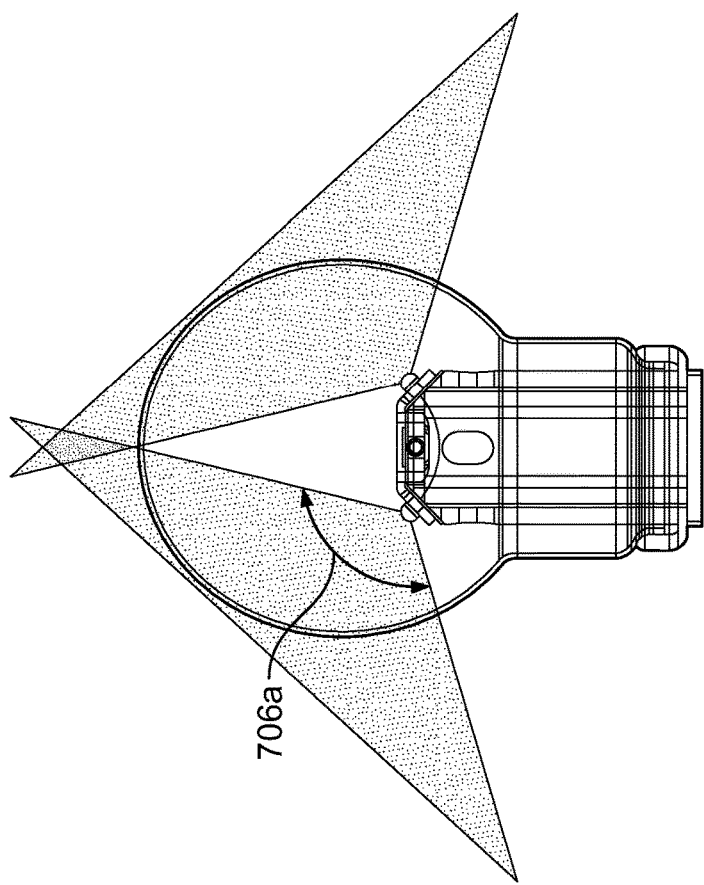

Referring to FIG. 7A through FIG. 7C, the results of illumination simulations are shown in one embodiment. FIG. 7A shows a simulated side view of the LED bulb, showing the light pattern of LEDs with a dispersion angle (706*a*) of 120°. FIG. 7B shows a simulated top view of the LED bulb, also showing the light pattern of LEDs with a dispersion angle (706*a*) of 120°. FIG. 7C shows a simulated top view of the pattern that would be formed on the surface of the glass bulb, with LEDs of the same dispersion characteristics as FIGS. 7A and 7B.

Clearly, LEDs with different dispersion angles, as well as bulb enclosures with different geometries, would mean that to achieve the optimal desired light pattern projected on the glass or plastic bulb enclosure (e.g., for a non-spherical bulb, such as a flat surfaced floodlight bulb), the characteristics of the components in FIG. 6A, FIG. 6B and FIG. 7, would be subject to change, in a variety of methods, including (but not limited to), the number of petals (607*d*) on the LED MCPCB (607) (or other LED PCB carrier technology), the number of LEDs (606) on each petal, the addition of LEDs on the flat area (607*c*) as shown in FIG. 6B, the bend angle of the petals relative to the flat area (607*f*), the shape of the underlying heatsink collar (609) to match that of the LED MCPCB (607) (or other LED PCB carrier technology), and the overall mechanical and thermal design of the heatsink collar (609) to allow appropriate heat dissipation for the application.

The MCPCB with a principal surface to the perpendicular main board, can be built with any number of petals which can be angled up or down from ±90° (this includes 0 degrees)—but places the antenna above the main MCPCB surface to increase radio communications. The angle may not be required and the petals may be on the same plane as the first surface, and the principal surface may not require formed petals, so the principal surface is flat and positioned perpendicular to the main PCB and its protruding tab.

Referring to FIG. 8A through FIG. 8L, an example sequence of assembly steps for the smart bulb embodiment is outlined. While this sequence is intended to demonstrate the simplicity and elegance of the mechanical design and assembly of one embodiment, one of ordinary skill in the art would recognize that many alternatives to this sequence are both possible and contemplated.

Referring to FIG. 8A, the main circuit board assembly (810) is inserted into the isolation sleeve's (811) PCB guide slots (811*b*), from the right. Note that in the reduced circumference cylinder wall area of the isolation sleeve (811) there is a single notch (811*a*). This is present to allow the connecting wire (814*b*) to pass through the isolation sleeve (811), where it will ultimately be terminated on the cap electrical contact (812*b*) (see FIG. 8H through 8J for additional details).

In FIG. 8B, thermal epoxy is applied to the (right) mating surface (809*i*) of the heatsink collar (809) and it is attached to the isolation sleeve (811). Vent holes (809*b*) can be seen as present on the cylinder wall of the heatsink collar (809). In one embodiment, a small raised bump (809*e*) is present on the mating surface of the heatsink collar (809), and there are two corresponding raised bumps (811*c*) on the isolations sleeve (811). The parts are designed such that the raised bump (809*e*) on the heatsink collar (809) fits between the two raised bumps (811*c*) on the isolation sleeve (811), providing a secure and precise location key mechanism to ensure the two parts (809 and 811) are aligned exactly. Other versions of the same location key scheme, or alternate key location schemes, are both obvious and contemplated.

In FIG. 8C, with the (optional) PCB guide slots in the heatsink collar (809) and the isolation sleeve (811) aligned, the main circuit board assembly (810) is pushed through the isolation sleeve (811), until it is fully engaged such that the tab (810*a*) protrudes from the slot (809*a*) in the cap of the heatsink collar (809). The location key previously described in FIG. 8B, formed by the raised bump (809*e*) on the heatsink collar (809) and the raised bumps (811*c*) on the isolation collar (811), when correctly engaged, guarantee that the tab (810*a*) on the main circuit board assembly (810) is correctly aligned as it passes through the slot (809*a*) in heatsink collar (809), such that traces on the main circuit board assembly (810) will not short circuit to the electrically conductive walls of the slot in the heatsink collar (809). In an alternate embodiment, the tab (810*a*) of the main circuit board assembly (810) may have an isolation sleeve, band, or other insulating material (not shown) placed around it, to prevent any possibility of shorting between the traces of the main circuit board assembly (810) and the slot (809*a*) in the heatsink collar (809).

Figure 8D:
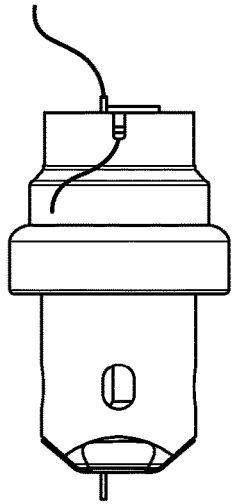
Figure 8E:
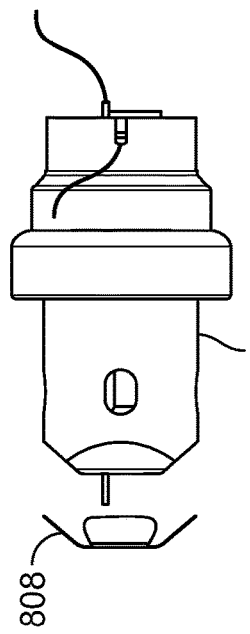
Figure 8F:
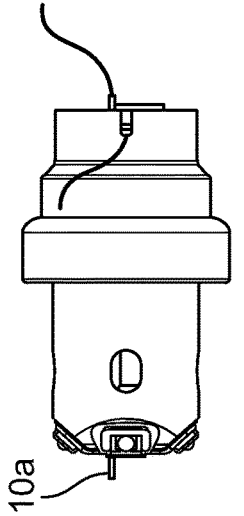
Figure 8F:
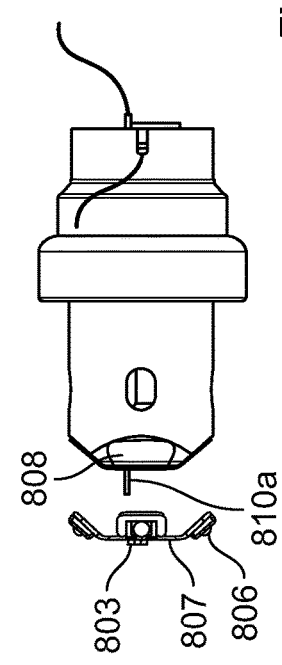
Figure 8F:
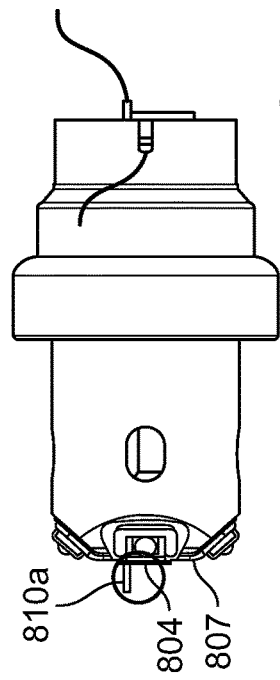

Referring to FIG. 8D, double-sided thermal adhesive tape (808) is applied to the cap of the heatsink collar (809). In FIG. 8E, the LED MCPCB (807) assembly is mounted on top of the thermal adhesive tape (808) added in the previous step, such that the tab (810*a*) of the main circuit board assembly (810) protrudes though the LED MCPCB (807). In this example, the LED MCPCB (807), the LEDs (806), and the Kapton tape (803) are assumed to be added as a completed sub-assembly. In FIG. 8F, the board-to-board connectors (804) are attached (soldered and/or press fitted), making the electrical connection between the main circuit board assembly tab (810*a*) and the LED MCPCB (807). FIG. 8G shows the antenna (802) being attached to the electrical contact pads on the main circuit board assembly tab (810*a*).

Figure 8J:
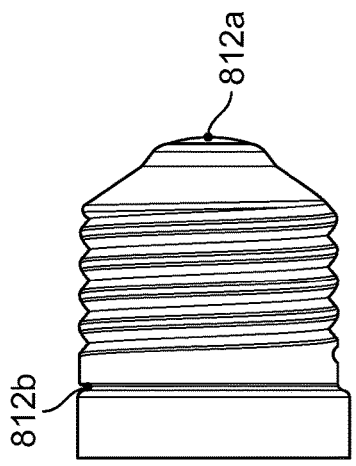

Referring to FIG. 8H, thermal epoxy is applied to the (right) mating surface of the isolation sleeve (811*d*) where the E26 base (812) is to be located, and it is attached, locating the connecting wires (814*a* and 814*b*) in their appropriate places. In an alternate embodiment, the E26 base (812) may be crimped onto the isolation sleeve, or a combination of adhesive and crimping may be employed. In FIG. 8I, the E26 base snap insert (813) for the tip electrical contact (814*a*) is inserted (and is screwed, epoxied, press fitted and/or soldered in place). In FIG. 8J, the excess wire on both the connecting wires (814*a* and 814*b*) is snipped off, and the contacts are (typically) soldered to form the tip electrical contact (812*a*) and the cap electrical contact (812*b*).

Figure 8K:
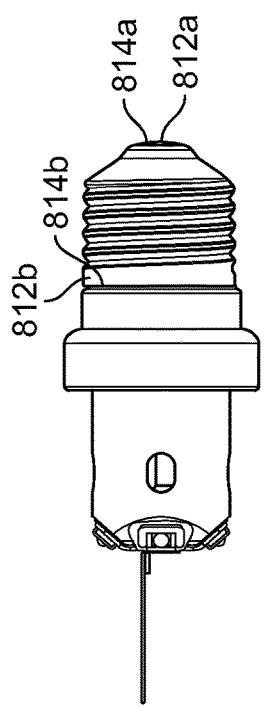
Figure 8K:
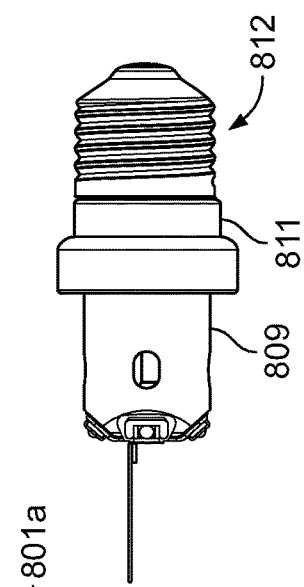
Figure 8L:
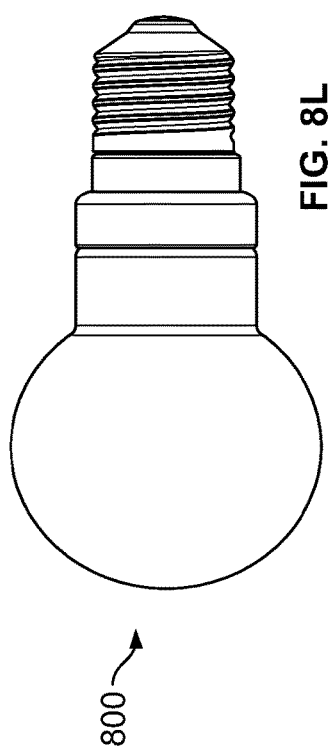

Referring to FIG. 8K, thermal epoxy is applied to the (right) mating surface (801*a*) of the glass or plastic bulb (801), and it is mounted to the heatsink collar (809) to complete the finished bulb assembly (800) of FIG. 8L.

A disadvantage of many standard LED bulbs is that they are specified for indoor use only. One of the reasons for this is that the LEDs are generally mounted on MCPCBs with no protection from condensing water vapor. Since the LEDs are not enclosed by conformal coating, hermetic sealing and/or a humidity controlled chamber, they are merely open to the atmosphere. Use of such bulbs in outdoor environments can lead to water vapor condensing on the unprotected LEDs or LED PCB, leading to a short circuit of the electrical drive to the LEDs, and failure to meet regulatory tests for water vapor or spray tests, and voltage withstand requirements.

In contrast, slightly modifying the sequence outlined in FIG. 8H through FIG. 8L allows the LED MCPCB to be housed in an environmentally sealed chamber. Assuming that the assembly process is carried out in a dehumidified air environment, this will ensure a non-condensing chamber exists in the glass (or plastic) bulb for the operational temperature range of interest. Inert gas and or a vacuum could be introduced into the glass bulb with some minor assembly modifications, such as fitting the glass bulb, using thermal epoxy (or similar) adhesive (originally in FIG. 8I), prior to applying the E26 base (originally in FIG. 8H). This would allow the interior of the bulb to be filled with any gas and/or evacuated to a controlled specification, via the hole in the E26 base, prior to fitting the E26 base snap insert (originally in FIG. 8I).

In an alternate embodiment, during the assembly process, the interior of the heatsink collar and isolation sleeve could be filled with thermally conductive and/or electrically insulating potting compound, completely encasing the main circuit board assembly. In another embodiment, conformal coating could be applied to the main circuit board prior to final assembly.

In an alternate embodiment as described in FIG. 8H, the E26 base (812) is remotely attached via a "pigtail" as an explicit E26 plug. In FIG. 8J, the excess wire on both the connecting wires (814*a* and 814*b*) are not snipped off, but are extended to the explicit E26 plug which terminates the "pigtails". This technique is typically used when an LED light or fitting provides an explicit E26 connector via a flying lead, and allows an LED proprietary lighting module to fit into and connect to the recessed can (or typically an alternative stationary housing). This is also often used when a normal E26 (for instance) incandescent or CFL bulb is being replaced by an LED proprietary lighting module, allowing it to fit in the recessed can (or typically an alternative stationary housing). In a further embodiment, the E26 base which terminates the flying lead, can be replaced with any required connector base, such as, but not limited to, E12, E14, E17, GU10, B22, etc.

Figure 9:
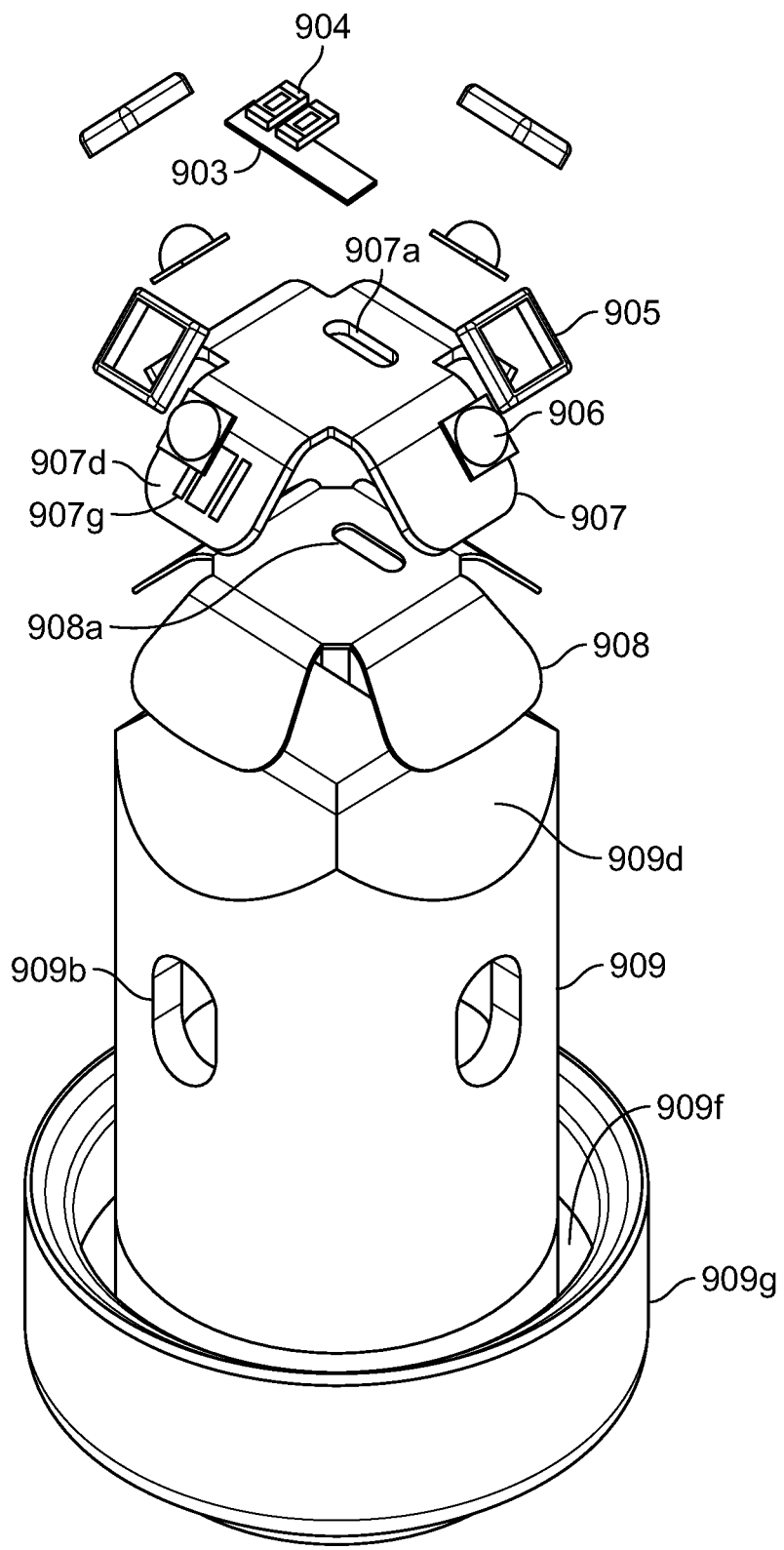
FIG. 9 is an illustrative diagram of the LED bulb or LED smart bulb heatsink collar, double-sided thermal adhesive tape, and LED MCPCB detailed assembly.

Referring to FIG. 9, further details of the heatsink collar (909), the double-sided thermal adhesive tape (908), or any alternate bonding material, and the LED MCPCB (907) assembly are shown. Heatsink collar (909) is shown with vent holes (909*b*) which allows enhanced heat circulation from the main printed circuit board assembly (not shown) to the chamber enclosed by the glass bulb (not shown). Angled shoulders (909*d*) on the top of the heatsink collar (909) provide an exact thermal and mechanical interference fit to the corresponding shape of the double-sided thermal adhesive tape (908) and the underside of the petals (907*d*) of the LED MCPCB (907), to maximize mechanical rigidity and heat transfer. The bend angle of the petals (907*d*) on the LED MCPCB (907) and the corresponding slope of the angled shoulders (909*d*) of the heatsink color (909) are chosen to optimize the radiated light performance of the 4 (in this example) SMT LEDs (906), which are soldered onto their corresponding pads (907*g*) on LED MCPCB (907). Slot (908*a*) in the thermal adhesive tape (908) and slot (907*a*) in the LED MCPCB (907) allow the tab on the main circuit board assembly (not shown) to pass through, such that electrical connections can be made between it and the LED MCPCB (907) and the antenna (not shown). Board-to-board connectors (904) connect the LED electrical drive from the main circuit board assembly (not shown) to the LED MCPCB (907), and are isolated from the traces on the LED MCPCB (907) using Kapton tape (903), or other insulating material (if required). LED rings (905) are (optionally)

mounted around the periphery of LEDs (906) to enhance voltage withstand performance (if necessary). At the base of the heatsink collar (909), a mounting ring (909f) is formed by an outer ring (909g), into which the glass bulb (not shown) is located, using thermal epoxy to form a seal, after which excess epoxy can be wiped away. The exterior edge of the outer ring (909g) is the only part of the heatsink collar (909) that is not contained within the glass bulb (not shown) once the smart bulb is fully assembled. This small surface area of the exposed heatsink, significantly reduces the burn risk due to inadvertent contact by users, over the prior art implementations.

In an alternate embodiment, the size of the surface of the outer ring (909g) of the heatsink collar (909) may be increased, decreased, or the overall shape may be modified, including but not limited to adding cooling fins or other physical attributes, to optimize the thermal dissipation of the LED bulb to match the required lumens output, and resultant power dissipation.

As described in FIG. 9 the LED MCPCB (907) is formed such that the outer wings or petals (907d) where the LEDs (906) are located are bent over to allow the light pattern to be dispersed in a more efficient way than mounting all the LEDs on a flat MCPCB and face in the identical planar direction. Further, the LED MCPCB (907) is a single continuous PCB entity, mounted at a right angle to, and accommodating projection from, the main circuit board assembly (not shown). The main circuit board assembly encompasses (among other functions) the LED driver circuits, and is attached to the LED MCPCB (or other LED PCB carrier technology), via board-to-board connecters (904), This is a further advantage over prior art, where to simulate a spatially omni-directional light source, multiple LED PCBs are required, facing in different directions, with connections required from each LED PCB, to the AC-to-DC conversion and regulation circuitry. The LEDs may be mounted on multiple PCBs (with their conjoined point-source heatsinks), which face towards each other, into the center of the bulb. In this case, any LED bank (and associated LED MCPCB/heatsink), casting light towards another LED bank (and LED MCPCB/heatsink) will cause a shadow to be cast. Alternately, LEDs may be mounted on multiple PCBs (with their conjoined point-source heatsinks), which face away from each other, from the center of the bulb, but these produce a very directional radiated pattern dependent on the angle (any how many) LED PCBs are incorporated. In either case, both configurations exhibit an unnatural radiated pattern from the source. None of these patterns mimic the omni-directional equivalent of the emitted light from the central filament of an incandescent bulb, as described by the present embodiment.

In a further advantage of the embodiment, any color of LED, or any plurality of colors of LED can be mounted on the LED MCPCB, allowing different colored bulbs to be offered from the identical design. In yet another embodiment, separate LED connectivity circuits can be implemented on the LED MCPCB, each circuit corresponding to a different colored LED (or plurality of LEDs), such as (but not limited to) a red LED circuit, green LED circuit, blue LED circuit and white LED circuit. Additional connectivity pads on the main circuit board and the LED MCPCB would be added as necessary to allow routing of the additional separate drive circuits, which can be easily achieved by expanding the signal carrying capability of the board-to-board interconnect.

The enhanced thermal conductivity offered by the unique mechanical design, makes the heatsink much smaller, and hence lighter. The resultant weight of the smart bulb is much more like the characteristic incandescent bulb it is designed to replace, and does not restrict its use in existing table or floor standing lamps.

While one embodiment calls for a glass bulb, which aids thermal performance of the bulb, in some applications it may be possible and/or preferable to substitute a plastic bulb. In either the case of a glass or plastic bulb, no chemical coating is required on the inside of the glass. For decorative purposes, the glass or plastic bulb may be clear or frosted, or may be colored.

Figure 10A:
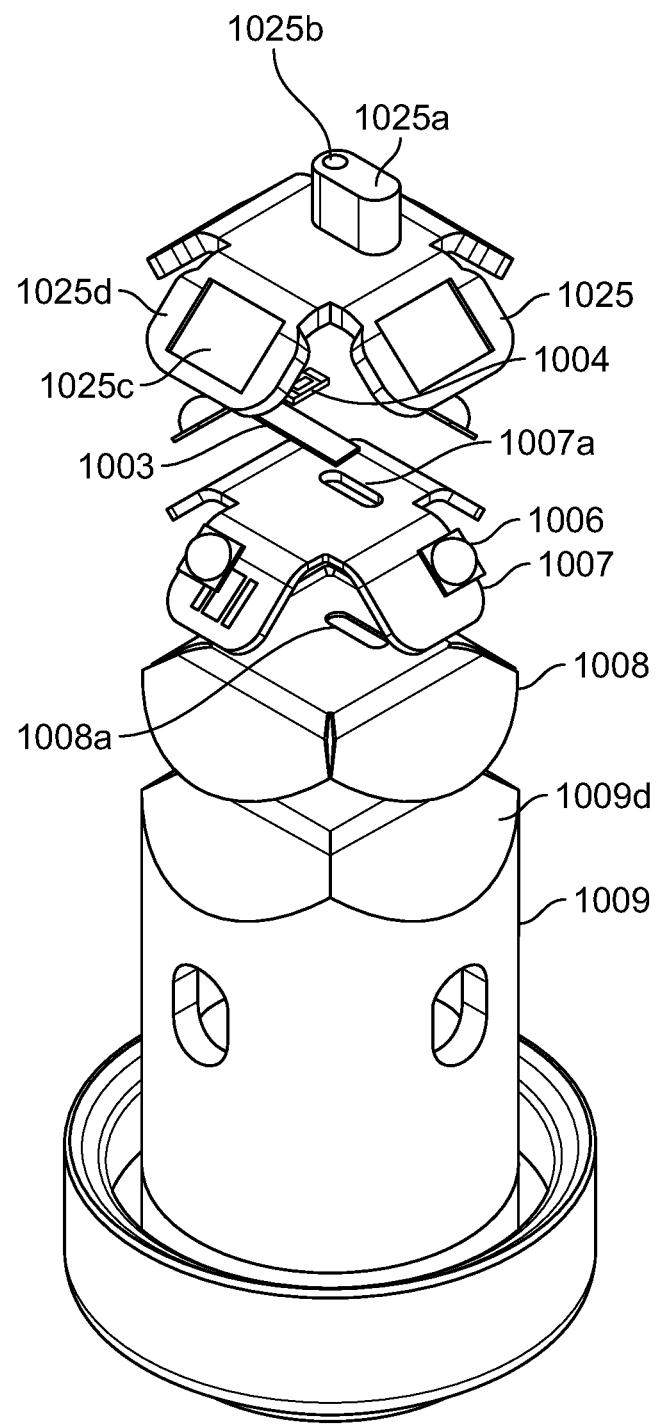
FIGS. 10A and 10B are illustrative diagrams of an LED smart bulb heatsink collar and LED MCPCB with different examples of isolation barriers.
Figure 10B:
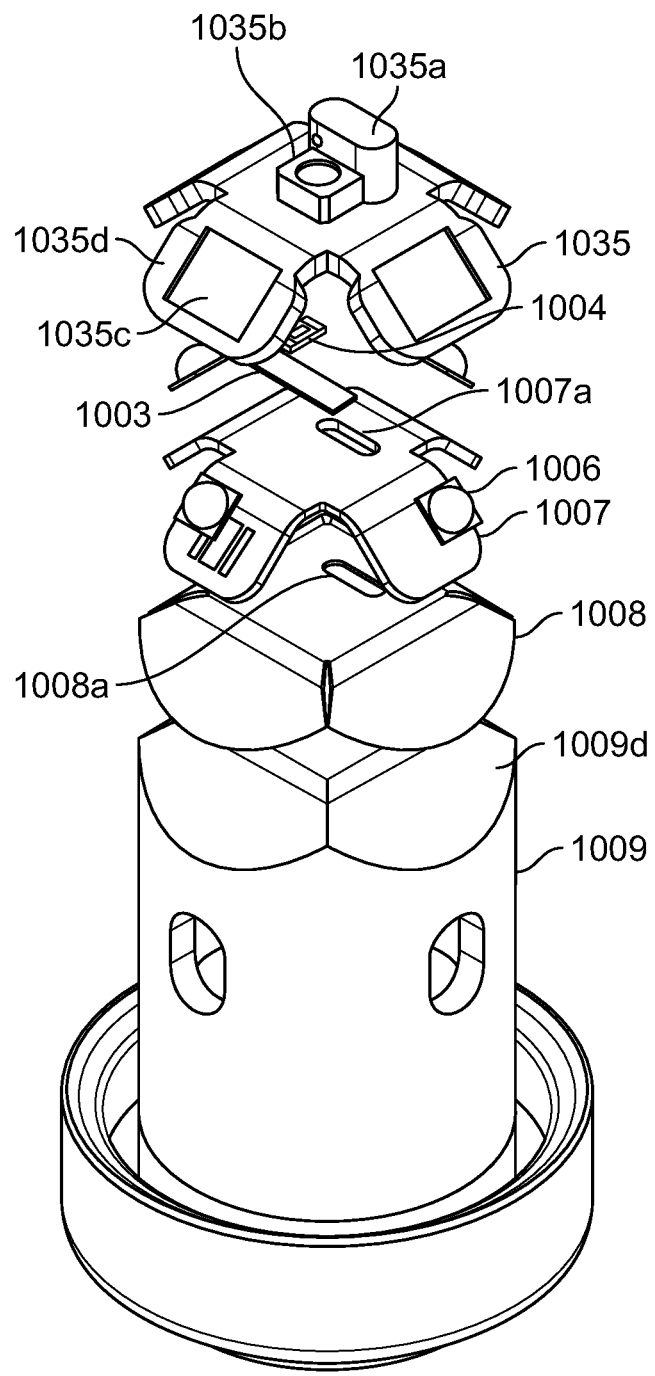

Referring to FIG. 10A and FIG. 10B, a detailed view of two configurations of an optional isolation barrier are shown. Such an isolation barrier may be necessary for additional regulatory compliance, and would generally be used instead of LED rings (see 905 in FIG. 9 for detail). In the first example embodiment, FIG. 10A shows an isolation barrier (1025) which forms an electrically non-conductive cover over the LED MCPCB (1007). LED access holes (1025c) are cut out of isolation barrier (1025) to allow illumination from the LEDs (1006) to pass through. A small PCB turret (1025a) is formed in isolation barrier (1025), and covers the tab on the main circuit board assembly (not shown, see 810a on FIG. 8G for example) that protrudes through the slot (1008a) in the thermal adhesive tape (1008) and slot (1007a) in the LED MCPCB (1007), and also encases the board-to-board connectors (1004) and Kapton tape (1003). An antenna egress hole (1025b) allows the antenna (not shown, see 802 on FIG. 8G for example) to pass through isolation barrier (1025) and connect to the pad(s) on the tab of the main circuit board (not shown, see 810a on FIG. 8G for example).

In the second example embodiment, FIG. 10B shows an isolation barrier (1035) forms an electrically non-conductive cover over the LED MCPCB (1007). LED access holes (1035c) are cut out of isolation barrier (1035) to allow illumination from the LEDs (1006) to pass through. A small PCB turret (1035a) is formed in isolation barrier (1035) and covers the tab on the main circuit board assembly (not shown, see 810a on FIG. 8G for example), that protrudes through the slot (1008a) in the thermal adhesive tape (1008) and slot (1007a) in the LED MCPCB (1007), and also encases the board-to-board connectors (1004) and Kapton tape (1003). In this embodiment, antenna enclosure (1035b) shrouds the antenna (not shown) under the top surface of isolation barrier (1035). While a toroidal form for antenna enclosure (1035b) is shown, any suitable antenna form appropriate to the antenna and/or radio of choice is both contemplated and anticipated.

Note that in FIG. 9, thermal adhesive tape (908) closely mirrors the shape of the LED MCPCB (907), whereas in FIG. 10A and FIG. 10B, thermal adhesive tape (1008), closely mirrors the entire top surface of the heatsink collar (1009), covering the angled shoulders (1009d). In one embodiment, the thermal adhesive tape (1008) left uncovered after the LED MCPCB (1007) is attached, may be used to secure the isolation barrier (1025, 1035), to the heatsink collar (1009). In this case, isolation barrier (1020, 1025) would be formed such that the four (in this example) petals or wings (1025d, 1035d) where the LED access holes (1025c, 1035c) are cut, would be enlarged to overlap the exposed areas of the thermal adhesive tape (1008). In an alternate embodiment, an adhesive (not shown) may be used to secure an isolation barrier (1025, 1035) to the surface of the LED MCPCB (1007), or a combination of the two approaches may be used.

Figure 11A:
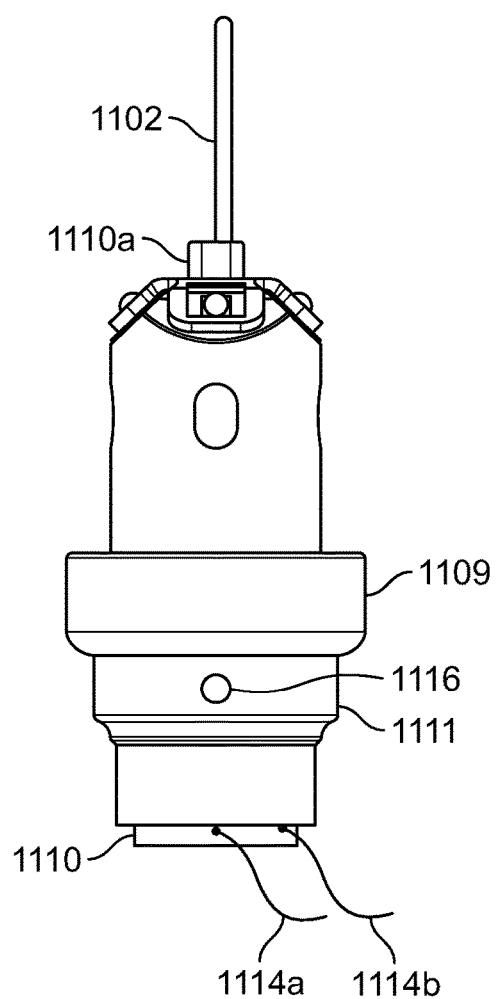
FIGS. 11A and 11B are illustrative diagram of an LED smart bulb with an external transducer or detector.
Figure 11B:
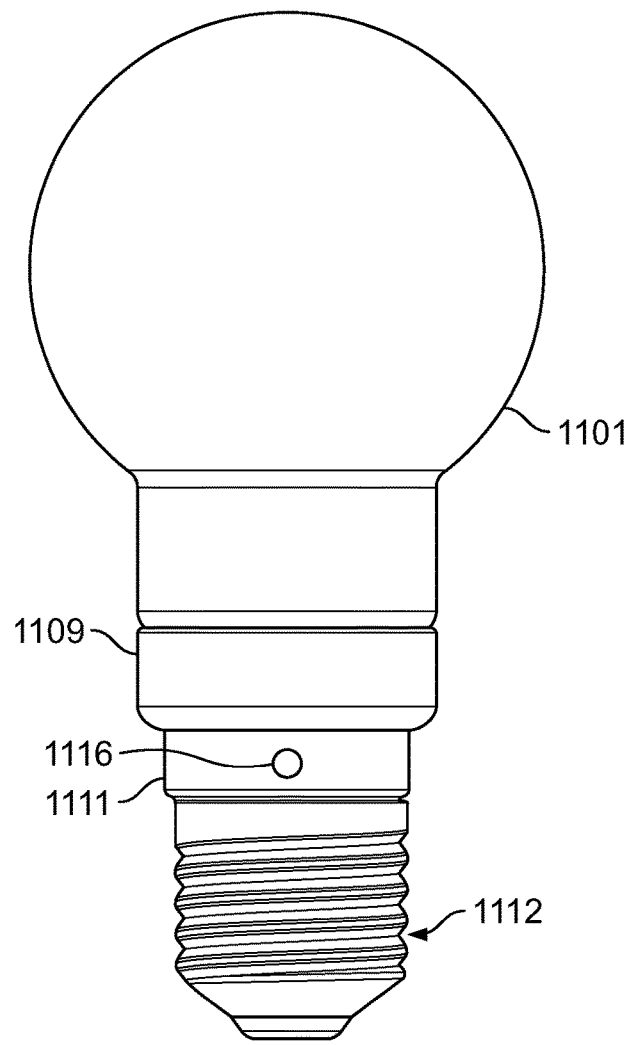

Referring to FIG. 11A and FIG. 11B, views of both a partially (FIG. 11A) and fully assembled (FIG. 11B) bulb are shown, indicating the location of an external transducer and/or detector. The partially assembled bulb of FIG. 11A has the glass or plastic bulb (1101) and E26 base (1112) removed, exposing the main circuit board (1110), main circuit board tab (1110a), main circuit board "pigtail" connection wires (1114a, 1114b), and antenna (1102), all items having been previously disclosed in (for instance) FIG. 4 and FIGS. 8A through 8L. An optional external transducer/detector (1116) may be mounted within the cylindrical isolation sleeve (1111), and attached to the circuitry of the main PCB (1110). Other mounting points for the external transducer/detector (1116) may be applicable dependent on use cases, and are both contemplated and anticipated. While a single instantiation of the external transducer/detector (1116) is shown, there may more than one instance of such. External transducer/detector (1116) may be a receiving device for the LED bulb to detect signals, such as (but not limited to) a proximity/motion detector, an RF, infrared or ultrasonic detector, an ambient and/or visible light sensor, an audio detector, a humidity detector or moisture sensor, a reset button, etc. Alternatively, external transducer/detector (1116) may be a transmitting device for the LED bulb to indicate its state or condition to an external entity, via another means, including (but not limited to) RF, infrared, ultrasonic, optical, etc.

Such external transducer/detector (1116) may be incorporated into a simple LED bulb, or an LED smart bulb.

FIG. 11A also clearly shows the placement of the simple monopole antenna (1102) in the preferred embodiment. FIG. 10B shows one alternate embodiment for antenna placement, mounted beneath antenna enclosure (1035b), where a toroid or chip antenna format may be used. Other embodiments may be possible including embedding the antenna into the side of the heatsink collar (1109). For instance, by elongating one of the vent holes (see 909b in FIG. 9 for detail), in a vertical direction, a slot can be produced where a simple monopole antenna can be placed, with an appropriate electrical connection to the main circuit board. For optimal RF performance, the antenna must be prevented from electrically shorting to the metal heatsink collar. This can be achieved during the assembly process, where either the elongated slot or some portion of the interior of the heatsink collar could be filled with thermally conductive and/or electrically insulating potting compound, encasing the antenna in the elongated slot in the heatsink collar to provide a secure mechanical location. Other antenna placements and configurations may be possible and do not depart from the overall described embodiment.

Referring to FIG. 12A and FIG. 12B, as well as FIG. 12C and FIG. 12D, alternate examples of board-to-board interconnect are shown. In FIG. 12A, an example of a "flex strip" connection is detailed. The LED MCPCB (1207) or a substantially similar thermally efficient PCB, is thermally and mechanically adhered to the heatsink collar (1209), using thermal adhesive tape (not shown, see 908 in FIG. 9, or 1008 in FIG. 10A or 10B), or any alternate bonding material. FIG. 12B shows an exploded detail view of the area of FIG. 12A, indicated by the outlined area designated by the label "12B". The main circuit board assembly tab (1210a) passes through the LED MCPCB (1207), and the two are connected via flex strip interconnect (1230). The pads (1210b) on the main circuit board assembly tab (1210a) and the pads (1207b) on the LED MCPCB (1207) are electrically connected through pads (1230a) at either end of the conductors of the flex strip (1230). While a two conductor flex strip implementation is shown, clearly other conductor arrangements are both possible and contemplated.

In FIG. 12C, an example of a "flexible PCB" connection is detailed. The LED MCPCB (1207) or a substantially similar thermally efficient PCB, is thermally and mechanically adhered to the heatsink collar (1209), using thermal adhesive tape (not shown, see 908 in FIG. 9, or 1008 in FIG. 10A or 10B), or any alternate bonding material. FIG. 12D shows an exploded detail view of the area of FIG. 12C, indicated by the outlined area designated by the label "12D". The main circuit board assembly tab (1210a) passes through the LED MCPCB (1207), and forces the flexible tab (1207h) built in to or attached to the flexible MCPCB (1207) (or equivalent), to be bent upwards, such that the pads (1207i) on the flexible tab (1207h) of the LED MCPCB (1207) align with the pads (1210b) of the main circuit board assembly tab (1210a).

Referring to FIG. 13A through 13C, an alternate embodiment of heatsink collar (1309) and LED "flexible PCB" (FPCB) (1307) is shown. In FIG. 13A, an exploded view of the heatsink collar (1309), thermal adhesive tape (1308) and an LED FPCB (1307) are shown. In one embodiment, a thermal extension pad (1309h) is located on each of the angled shoulders (1309d) of heatsink collar (1309). LED FPCB (1307) uses flexible PCB technology without requiring a metal core layer sandwiched within the PCB, hence eliminating the requirement for an MCPCB. Cutouts (1308b) in thermal adhesive tape (1308), correspond to the thermal extension pad (1309h) locations of heatsink collar (1309), and similar access slots (1307j) in the LED FPCB (1307) allow the heatsink collar (1309) to be in direct contact with the substrate of the LEDs (1306) mounted on the LED FPCB (1307). The LEDs (1306) are soldered onto their corresponding pads (1307g) on LED FPCB (1307) using an appropriate SMT solder process, prior to the flexible PCB (1307) being bent. Note that in FIG. 13A, the LEDs (1306) are shown as not attached to the LED FPCB (1307), which is for illustrative purposes only.

In an alternative embodiment, heatsink collar (1309) could have multiple thermal extension pads (1309h) located on the angled shoulders (1309d) of heatsink collar (1309), corresponding to multiple LEDs (1306), mounted on the petals (1307d) of the LED FPCB (1307).

In FIG. 13B, the thermal extension pad (1309h), is clearly shown protruding through both the thermal adhesive tape (1308) and the LED FPCB (1307), such that it is within the solder pads (1307g) of the LED FPCB (1307) and in direct contact with the substrate of the LED (1306). While thermal adhesive tape (1308) is used primarily for adhesion to, and additional heat transfer between, the LED FPCB (1307) and the heatsink collar (1309), additional thermal paste and/or adhesive may be employed to optimize the point-source heat transfer from the LEDs (1306) to the thermal extension pad (1309h) of the heatsink collar (1309). Note that in FIG. 13B, one LED (1306) is shown as not attached to the LED FPCB (1307), which is for illustrative purposes only.

In FIG. 13C, the completed assembly is shown as it would be in normal production. The access slot (1307a) for the main circuit board assembly (not shown) is clearly visible, as are the pads (1307b) for the board-to-board interconnect (not shown).

While this present disclosure has been described in detail and focuses on an LED bulb example which replaces an incandescent and/or CFL bulb, with the traditional A19 form factor with the E26 connector, the principles disclosed can be applied to many other lighting products. Many LED illumination products that replace other incandescent and CFL bulb form factors can also be manufactured in concert with the processes disclosed.

This present disclosure and principles as described, can be applied to any new replacement LED light or bulb, and can be developed and reconfigured to be compatible with any electrical lighting fitting, which uses any alternate electrical connection to power the LED light bulb or LED module, and using any existing and/or newly developed connection method. For example, existing connections included, but not limited to, form factors such as E12, (such as candelabra lights), GUI10/GU5.3, (such as MR16 and MR16 spot lights), European bayonet B22 (such as A60 bulbs), and E26 (including examples as A19, PAR bulbs, BR bulbs, recessed lights), etc., as well as new connections that are yet to be developed.

The present disclosure has been described in particular detail with respect to possible embodiments. Those skilled in the art will appreciate that the disclosure may be practiced in other embodiments. The particular naming of the components, capitalization of terms, the attributes, data structures, or any other programming or structural aspect is not mandatory or significant, and the mechanisms that implement the disclosure or its features may have different names, formats, or protocols. The particular division of functionality between the various systems components described herein is merely example and not mandatory; functions performed by a single system component may instead be performed by multiple components, and functions performed by multiple components may instead be performed by a single component.

In various embodiments, the present disclosure can be implemented as a system or a method for performing the above-described techniques, either singly or in any combination. The combination of any specific features described herein is also provided, even if that combination is not explicitly described.

As used herein, any reference to "one embodiment" or to "an embodiment" means that a particular feature, structure, or characteristic described in connection with the embodiments is included in at least one embodiment of the disclosure. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The terms "a" or "an," as used herein, are defined as one as or more than one. The term "plurality," as used herein, is defined as two or as more than two. The term "another," as used herein, is defined as at least a second or more.

An ordinary artisan should require no additional explanation in developing the methods and systems described herein but may find some possibly helpful guidance in the preparation of these methods and systems by examining standardized reference works in the relevant art.

While the disclosure has been described with respect to a limited number of embodiments, those skilled in the art, having benefit of the above description, will appreciate that other embodiments may be devised which do not depart from the scope of the present disclosure as described herein. It should be noted that the language used in the specification has been principally selected for readability and instructional purposes, and may not have been selected to delineate or circumscribe the inventive subject matter. The terms used should not be construed to limit the disclosure to the specific embodiments disclosed in the specification and the claims, but the terms should be construed to include all methods and systems that operate under the claims set forth herein below. Accordingly, the disclosure is not limited by the disclosure, but instead its scope is to be determined entirely by the following claims.

What is claimed and desired to be secured by Letters Patent of the United States is:

1. An LED light bulb, comprising:
    a first circuit board serving to operate substantially a first set of functions, the first circuit board capable of LED drive control of the bulb; and
    a second circuit board serving to operate substantially a second set of functions, the first circuit board communicatively coupled to the second circuit board;
    wherein the first circuit board having a shape with one or more tab portions and a main portion, the one or more tab portions of the first circuit board protrude through the second circuit board and are substantially perpendicular to the second circuit board;
    wherein the second circuit board comprises a principal surface that is positioned to enhance spatial light distribution, and
    wherein one or more LEDs are disposed on and electrically connected to the principal surface of the second circuit board, the principal surface being electrically coupled to the one or more tab portions of the first circuit board and electrically coupled to an antenna.

2. The LED light bulb of claim 1, wherein the single tab portion of the first circuit board provides connectivity to the antenna which is disposed above the principal surface of the second circuit board.

3. The LED light bulb of claim 1, wherein the one or more tab portion of the first circuit board provides connectivity to the one or more LEDs which are disposed on the principal surface of the second circuit board.

4. The LED light bulb of claim 1, wherein the one or more tab portions comprise a single tab portion.

5. An LED light bulb, comprising:
    a first circuit board having a shape with one or more tab portions and a main portion, the first circuit board serving to operate substantially a first set of functions, the first circuit board providing an LED drive control of the bulb; and a second circuit board communicatively coupled to the first circuit board and having a plurality of surfaces, the plurality of surfaces having a principal surface and a plurality of angled surrounding surfaces that are positioned angularly relative to the principal surface to enhance spatial light distribution, the second circuit board serving to operate substantially a second set of functions, the surfaces of the second circuit board disposed with and electrically connected to a plurality of LEDs;

wherein the one or more tab portions of the first circuit board protrudes through the second circuit board and positioned substantially perpendicular to the second circuit board;

wherein the principal surface of the second circuit board is electrically coupled to the one or more tab portions of the first circuit board and electrically coupled to the surrounding surfaces, at least one of the tab portions of the first circuit board electrically coupled to an antenna.

6. The LED light bulb of claim 5, wherein the first circuit board is configured to provide LED drive control of the bulb.

7. A smart LED light bulb, comprising:

a first circuit board having a shape with a one or more tab portions and a main portion, the first circuit board serving to operate substantially a first set of functions including processing and wireless communication functions, the first circuit board providing an LED drive control of the bulb; and a second circuit board communicatively coupled to the first circuit board and having a plurality of surfaces, the plurality of surfaces having a principal surface and a plurality of angled surrounding surfaces that are positioned angularly relative to the principal surface to enhance spatial light distribution, the second circuit board serving to operate substantially a second set of functions, the surfaces of the second circuit board disposed with and electrically connected to a plurality of LEDs;

wherein the one or more tab portions of the first circuit board protrudes through the second circuit board and positioned substantially perpendicular to the second circuit board;

wherein the principal surface of the second circuit board is electrically coupled to the one or more tab portions of the first circuit board and electrically coupled to the surrounding surfaces, at least one of the tab portions of the first circuit board electrically coupled to an antenna.

8. The smart LED light bulb of claim 6, wherein the first circuit board is configured to provide LED drive control of the bulb.

* * * * *